(12) United States Patent
Nosho et al.

(10) Patent No.: US 12,200,927 B2
(45) Date of Patent: Jan. 14, 2025

(54) MEMORY DEVICE INCLUDING REFERENCE BIT LINE FOR INCREASING READ OPERATION ACCURACY

(71) Applicant: SUNRISE MEMORY CORPORATION, San Jose, CA (US)

(72) Inventors: Yosuke Nosho, Tokyo (JP); Takashi Ohashi, Tokyo (JP); Shohei Kamisaka, Kangawa (JP); Takashi Hirotani, Kanagawa (JP)

(73) Assignee: SUNRISE MEMORY CORPORATION, San Jose, CA (US)

( * ) Notice: Subject to any disclaimer, the term of this patent is extended or adjusted under 35 U.S.C. 154(b) by 410 days.

(21) Appl. No.: 17/576,544

(22) Filed: Jan. 14, 2022

(65) Prior Publication Data

US 2022/0238536 A1 Jul. 28, 2022

(30) Foreign Application Priority Data

Jan. 27, 2021 (JP) .................................. 2021-10812

(51) Int. Cl.
*H10B 43/23* (2023.01)
*G11C 7/06* (2006.01)
*G11C 7/14* (2006.01)
*G11C 7/18* (2006.01)
*G11C 8/14* (2006.01)
(Continued)

(52) U.S. Cl.
CPC .............. *H10B 43/23* (2023.02); *G11C 7/18* (2013.01); *G11C 8/14* (2013.01); *H10B 41/10* (2023.02); *H10B 41/23* (2023.02); *H10B 43/10* (2023.02)

(58) Field of Classification Search
CPC ........ H10B 43/00–50; H10B 41/00–70; G11C 8/14; G11C 7/18; H01L 29/40117; H01L 29/66833; H01L 29/792
See application file for complete search history.

(56) References Cited

U.S. PATENT DOCUMENTS 6,894,922 B1  5/2005  Hidaka
9,412,752 B1  8/2016  Yeh et al.
(Continued)

OTHER PUBLICATIONS

"Japanese Patent Application No. 2021-10812", in the name of Sunrise Memory Corporation, Jan. 27, 2021.
(Continued)

*Primary Examiner* — Sonya McCall-Shepard

(57) ABSTRACT

A memory device includes source-drain structure bodies and gate structure bodies arranged along a first direction, and global word lines. The source-drain structure body includes a bit line, and first to third semiconductor layers. The first and second semiconductor layers are of first conductivity type and the first semiconductor layer is connected to the bit line. The third semiconductor layer of a second conductivity type contacts the first and second semiconductor layers. The gate structure body includes a local word line and a charge storage film. A first source-drain structure body includes a bit line forming a first reference bit line. A first global word line connects to the local word lines in the gate structure bodies formed on both sides of the first reference bit line and to the local word lines formed in alternate gate structure bodies that are formed between the remaining plurality of source-drain structure bodies.

11 Claims, 22 Drawing Sheets

(51) Int. Cl.
*H10B 41/10* (2023.01)
*H10B 41/23* (2023.01)
*H10B 41/27* (2023.01)
*H10B 43/10* (2023.01)
*H10B 43/27* (2023.01)

(56) References Cited

U.S. PATENT DOCUMENTS

| | | |
|---|---|---|
| 10,121,553 B2 | 11/2018 | Harari et al. |
| 2007/0165459 A1 | 7/2007 | Nazarian |
| 2007/0165469 A1 | 7/2007 | Rehm et al. |
| 2008/0205140 A1 | 8/2008 | Lee et al. |
| 2014/0286097 A1* | 9/2014 | Lue ............... H01L 29/792 365/185.09 |
| 2017/0018567 A1* | 1/2017 | Iinuma ............. H10B 43/27 |
| 2019/0325946 A1 | 10/2019 | Lu |
| 2020/0365609 A1 | 11/2020 | Harari et al. |

OTHER PUBLICATIONS

"PCT Search Report and Written Opinion, PCT/US2022/012521", Apr. 11, 2022, 14 pages.

\* cited by examiner

MEMORY DEVICE INCLUDING REFERENCE BIT LINE FOR INCREASING READ OPERATION ACCURACY

CROSS REFERENCE TO RELATED APPLICATIONS

This application claims the benefits of Patent Application No. 2021-010812 filed in Japan on Jan. 27, 2021, which is incorporated herein by reference for all purposes.

FIELD

Embodiments relate to a memory device and a method for manufacturing the same.

BACKGROUND

In recent years, a stacked memory device in which memory cells are three-dimensionally integrated is being developed to realize higher integration of the memory device. Higher accuracy of the read operation of the stacked memory device is desirable.

SUMMARY

According to embodiments of the invention, a memory device and a method for manufacturing a memory device are provided in which the accuracy of the read operation can be increased.

According to one embodiment, a memory device includes a plurality of source-drain structure bodies and a plurality of gate structure bodies arranged along a first direction, and a plurality of global word lines. Each of the source-drain structure bodies includes a bit line, a first semiconductor layer, a second semiconductor layer, and a third semiconductor layer. The bit line extends in a second direction perpendicular to the first direction. The first semiconductor layer extends in the second direction, is connected to the bit line, and is of a first conductivity type. The second semiconductor layer extends in the second direction, is separated from the first semiconductor layer in a third direction, and is of the first conductivity type. The third direction is perpendicular to a plane parallel to the first and second directions. The third semiconductor layer contacts the first and second semiconductor layers and is of a second conductivity type. Each of the gate structure bodies includes a local word line extending in the third direction, and a charge storage film provided between the third semiconductor layer and the local word line. A first source-drain structure body includes a bit line forming a first reference bit line, and a first global word line connects to the local word lines in the gate structure bodies formed on both sides of the first reference bit line and to the local word lines formed in alternate gate structure bodies that are formed between the remaining plurality of source-drain structure bodies.

According to another embodiment, a method is disclosed for manufacturing a memory device. The method includes forming a memory structure body having a plurality of source-drain structure bodies and a plurality of gate structure bodies arranged along a first direction. The method includes forming an insulating film on the memory structure body. The method includes forming a plurality of mandrel members on the insulating film. The plurality of mandrel members are arranged along a second direction perpendicular to the first direction. The method includes slimming the plurality of mandrel members. The method includes forming sidewall structure on side surfaces of the plurality of mandrel members. The method includes removing the plurality of mandrel members. The sidewall structures form a first closed region and a second closed region arranged in the second direction and separated from each other. The method includes forming a first pattern and a second pattern. The first pattern subdivides an open region between the first closed region and the adjacent second closed region and the second pattern surrounding an end portion in the first direction of the open region being subdivided. The method includes forming a plurality of openings by etching the insulating film by using the sidewall structures, the first pattern, and the second pattern as a mask. And the method includes forming a global word line in the plurality of openings.

According to another embodiment, a method is disclosed for manufacturing a memory device. The method includes making an intermediate structure body having a plurality of source-drain structure bodies and a plurality of insulating members arranged along a first direction. The method includes forming a mask pattern on the intermediate structure body. The mask pattern has a first opening exposing one of the insulating members, and a second opening exposing two adjacent insulating members of the insulating members and one of the source-drain structure bodies between the two adjacent insulating members. The method includes forming first holes in the insulating member by etching the intermediate structure body by using the mask pattern as a mask. The method includes filling sacrifice members in the first holes. The method includes forming second holes by removing portions of the insulation members located between the first holes. The method includes forming a charge storage film on inner surfaces of the second holes. The method includes forming local word lines by filling a conductive layer into the second holes. And the method includes forming a plurality of global word lines extending in the first direction. The method forms a first set of local word lines in the second holes between the first openings and forms a second set of local word lines in the second holes between the second openings, each global word line connecting to the local word lines of the first set in alternate members and to the local word lines of the second set.

According to embodiments of the invention, a memory device and a method for manufacturing the memory device can be realized in which the accuracy of the read operation can be increased.

DETAILED DESCRIPTION

Embodiments of the invention will now be described with reference to the drawings.

The drawings described below are schematic, and are exaggerated or simplified as appropriate for easier viewing of the drawings. For example, there are cases where only major components are shown, and the other components are not illustrated. The configurations and dimensional ratios do not always match between the drawings, even for identical components.

First Embodiment

Figure 1:
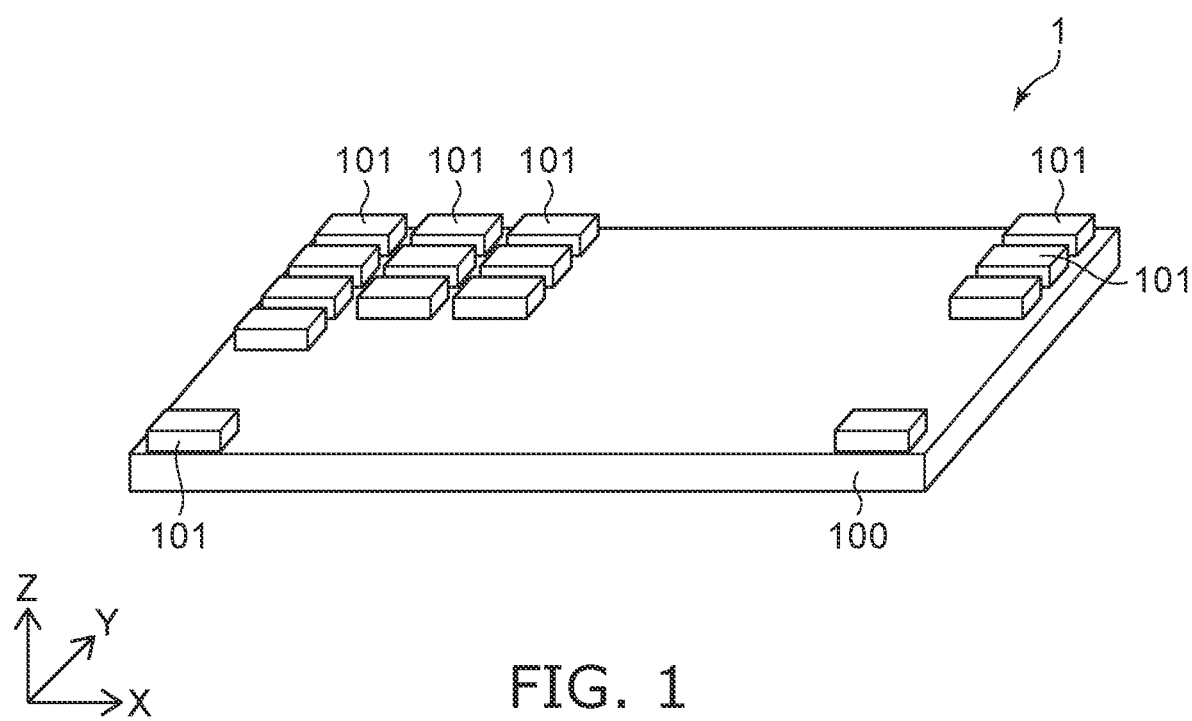
FIG. 1 is a perspective view illustrating a memory device according to a first embodiment of the invention.

FIG. 1 is a perspective view showing a memory device according to the first embodiment of the present invention.

In the memory device 1 according to the embodiment as shown in FIG. 1, a semiconductor substrate 100 is provided, and multiple tiles 101 are arranged in a plane on the semiconductor substrate 100. The semiconductor substrate 100 is, for example, a p-type silicon substrate.

In the specification hereinbelow, an XYZ orthogonal coordinate system is employed for convenience of description. Two mutually-orthogonal directions parallel to the upper surface of the semiconductor substrate 100 are taken as an "X-direction" and a "Y-direction". For example, the multiple tiles 101 are arranged in a matrix configuration along the X-direction and the Y-direction. A direction perpendicular to the upper surface of the semiconductor substrate 100 is taken as a "Z-direction". Although a direction that is in the Z-direction from the semiconductor substrate 100 toward the tiles 101 also is called "up" and the reverse direction also is called "down", these expressions are for convenience and are independent of the direction of gravity.

A general configuration of the tile 101 will now be described.

Figure 2:
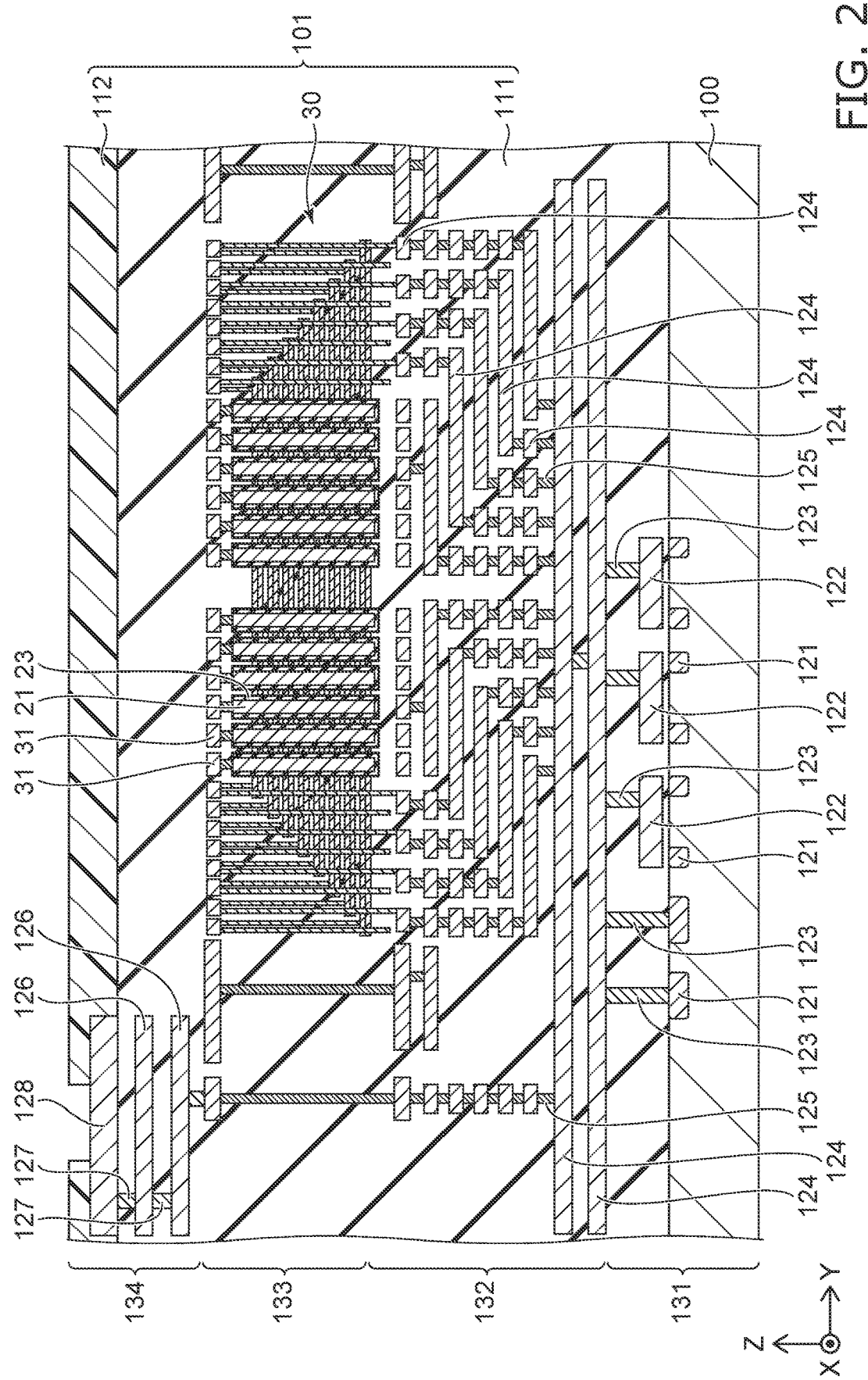
FIG. 2 is a cross-sectional view illustrating one tile of the memory device according to the first embodiment.

FIG. 2 is a cross-sectional view showing one tile of the memory device according to the first embodiment.

In the tile 101 as shown in FIG. 2, an inter-layer insulating film 111 and a passivation film 112 are stacked in this order upward from the substrate 100 below. The inter-layer insulating film 111 contacts the upper surface of the semiconductor substrate 100. For example, the inter-layer insulating film 111 is formed of silicon oxide (SiOx). For example, the passivation film 112 is formed of polyimide.

Many p-type or n-type impurity diffusion layers 121, and other structures, such as STI (Shallow Trench Isolation structures)(not shown), are formed in the upper portion of the semiconductor substrate 100. Gate electrodes 122 and contacts 123 are provided in the lower portion of the inter-layer insulating film 111. The gate electrodes 122 are insulated from the semiconductor substrate by a gate oxide film. Circuit elements such as MOSFETs (Metal-Oxide-Semiconductor Field-Effect Transistors), etc., are formed in the semiconductor substrate 100 by the impurity diffusion layers 121, the gate oxide film and the gate electrodes 122, etc. The circuit elements are formed in a circuit element formation layer 131 which includes the upper portion of the semiconductor substrate 100 and the lower portion of the inter-layer insulating film 111.

Multiple layers of interconnects 124 and vias 125 are formed on the circuit element formation layer 131 in the inter-layer insulating film 111. A lower layer interconnect layer 132 includes the interconnects 124 and the vias 125. The peripheral circuit of the memory device 1 is formed in the circuit element formation layer 131 and the lower layer interconnect layer 132.

A portion of the inter-layer insulating film 111 positioned above the lower layer interconnect layer 132 is a memory array portion 133. The configuration of the memory array portion 133 is described below.

The portion of the inter-layer insulating film 111 positioned above the memory array portion 133 and the portion in which the passivation film 112 is located are included in an upper layer interconnect layer 134. In the upper layer interconnect layer 134, interconnects 126 and vias 127 are provided in the inter-layer insulating film 111, and a pad 128 is provided on the inter-layer insulating film 111. The central portion of the pad 128 is exposed from under the passivation film 112.

Although a configuration is described as an example in the present embodiment in which the peripheral circuit is formed under the memory array portion 133, the invention is not limited thereto. For example, both the memory array portion and the peripheral circuit may be directly formed on the semiconductor substrate. In such a case, for example, the peripheral circuit is located at the periphery of the memory array portion. Alternately, the peripheral circuit may be formed on another semiconductor substrate. In such a case, for example, the semiconductor substrate in which the memory array portion is formed and the semiconductor substrate in which the peripheral circuit is formed are bonded together after formation.

The configuration of the memory array portion 133 will now be described.

Figure 3A:
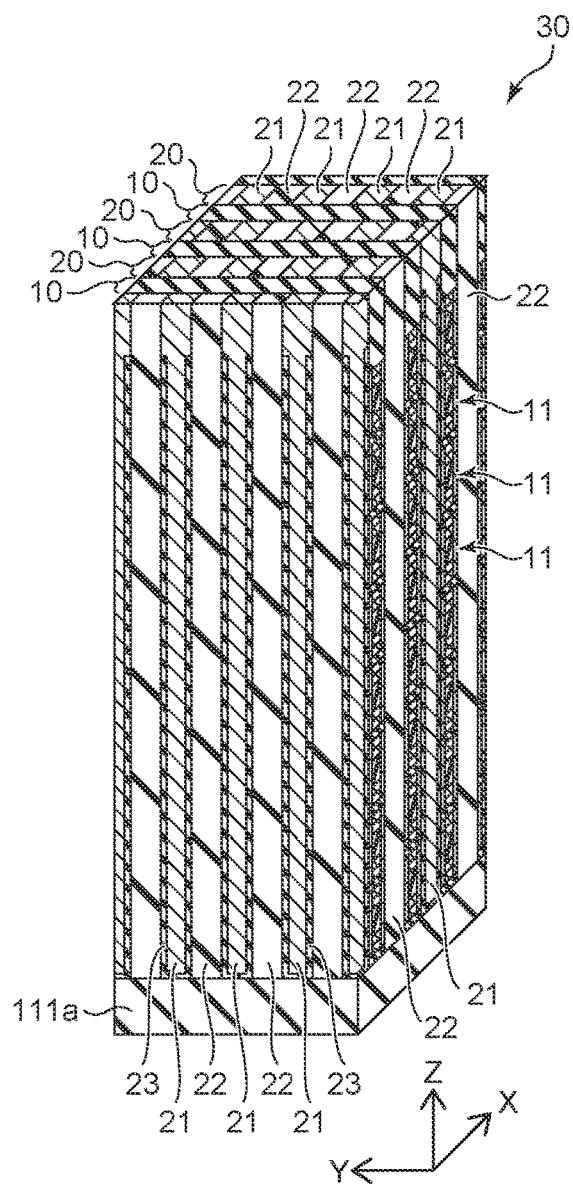
FIGS. 3A and 3B are perspective views showing a memory array portion of the memory device according to the first embodiment.
Figure 3B:
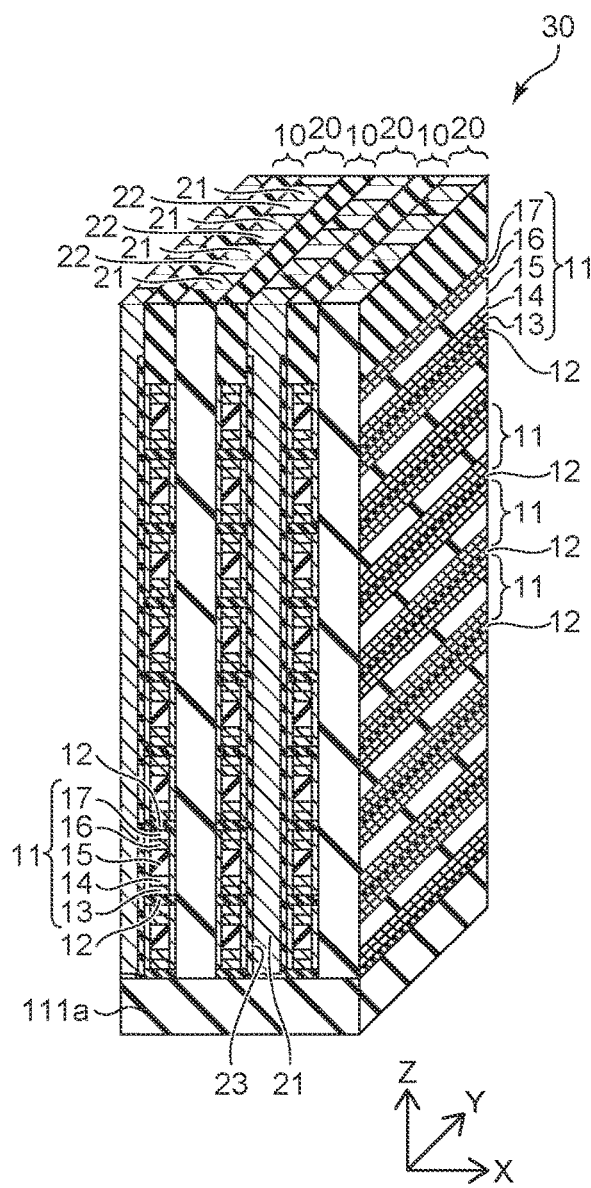

FIGS. 3A and 3B are perspective views showing the memory array portion of the memory device according to the first embodiment.

Figure 4:
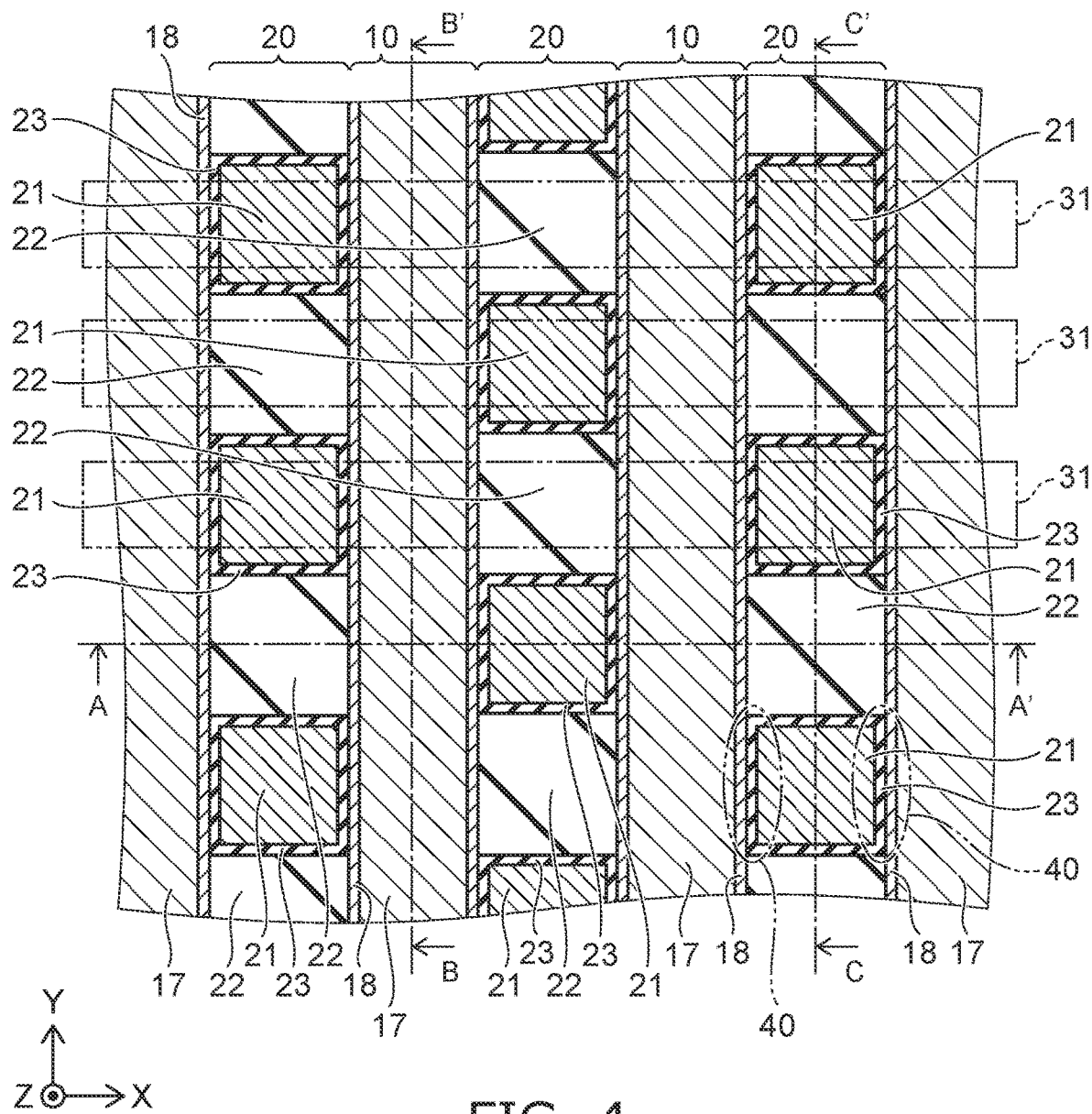
FIG. 4 is a plan view showing the memory array portion of the memory device according to the first embodiment.

FIG. 4 is a plan view showing the memory array portion of the memory device according to the first embodiment.

Figure 5:
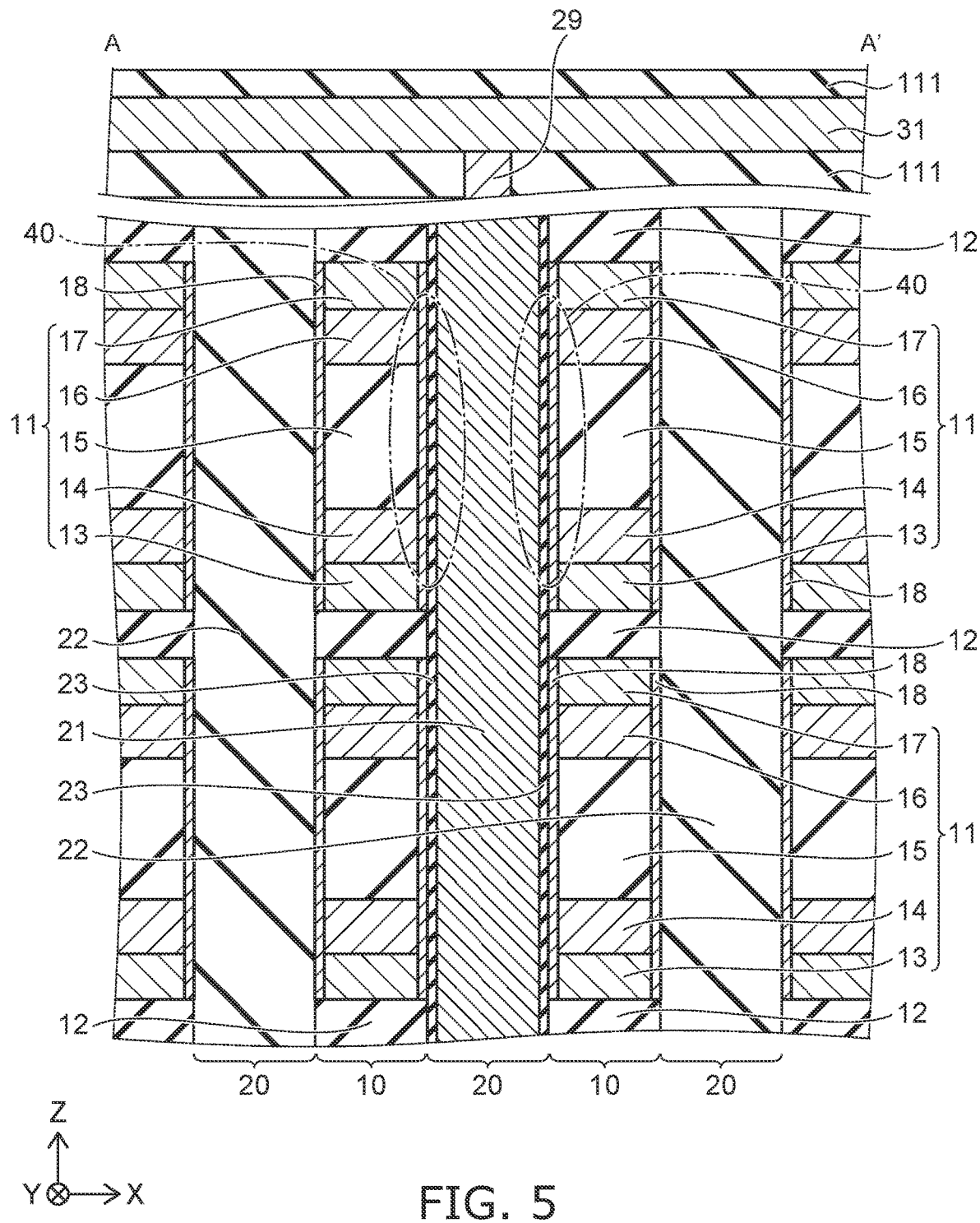
FIG. 5 is a cross-sectional view along line A-A' shown in FIG. 4.

FIG. 5 is a cross-sectional view along line A-A' shown in FIG. 4.

Figure 6:
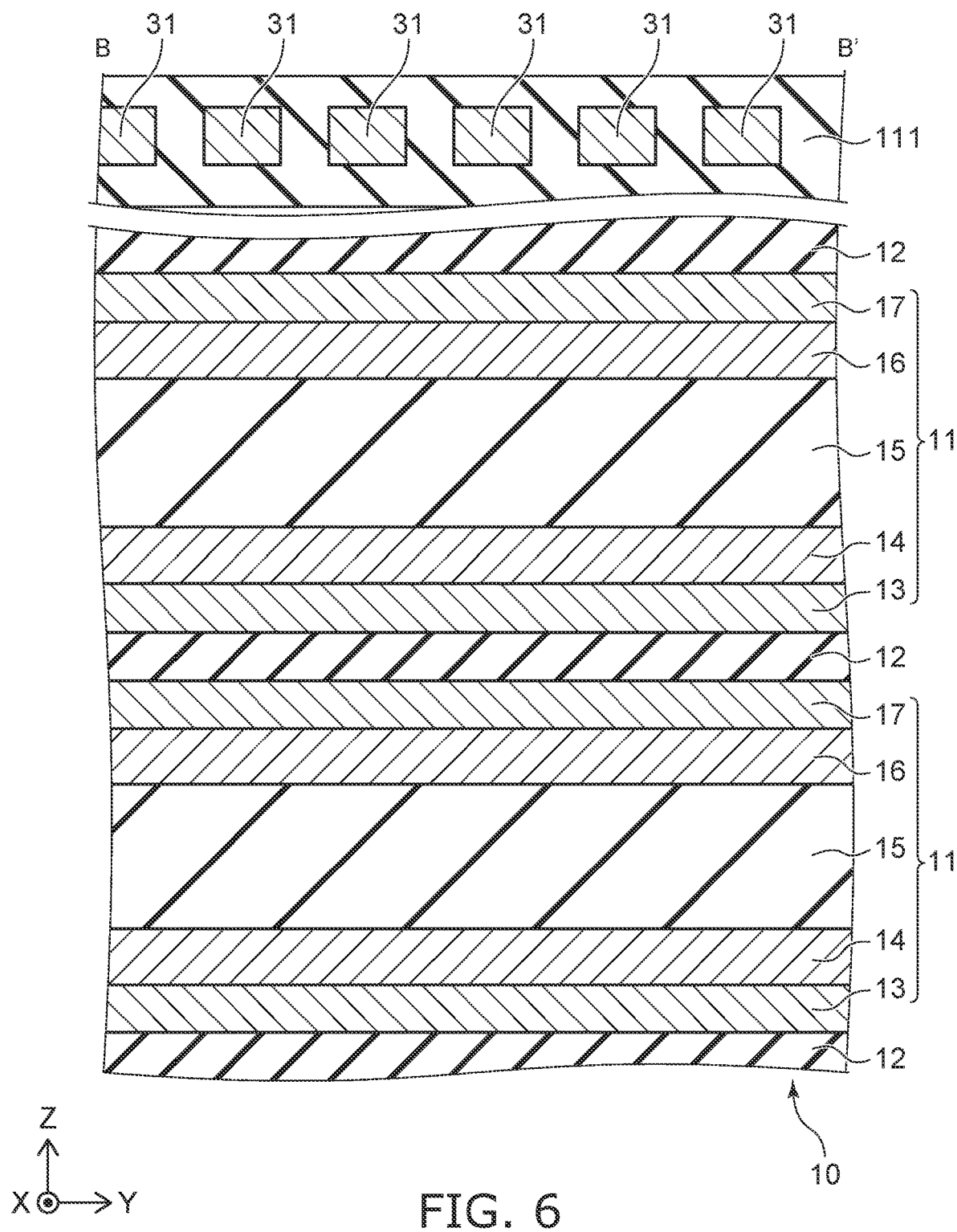
FIG. 6 is a cross-sectional view along line B-B' shown in FIG. 4.

FIG. 6 is a cross-sectional view along line B-B' shown in FIG. 4.

Figure 7:
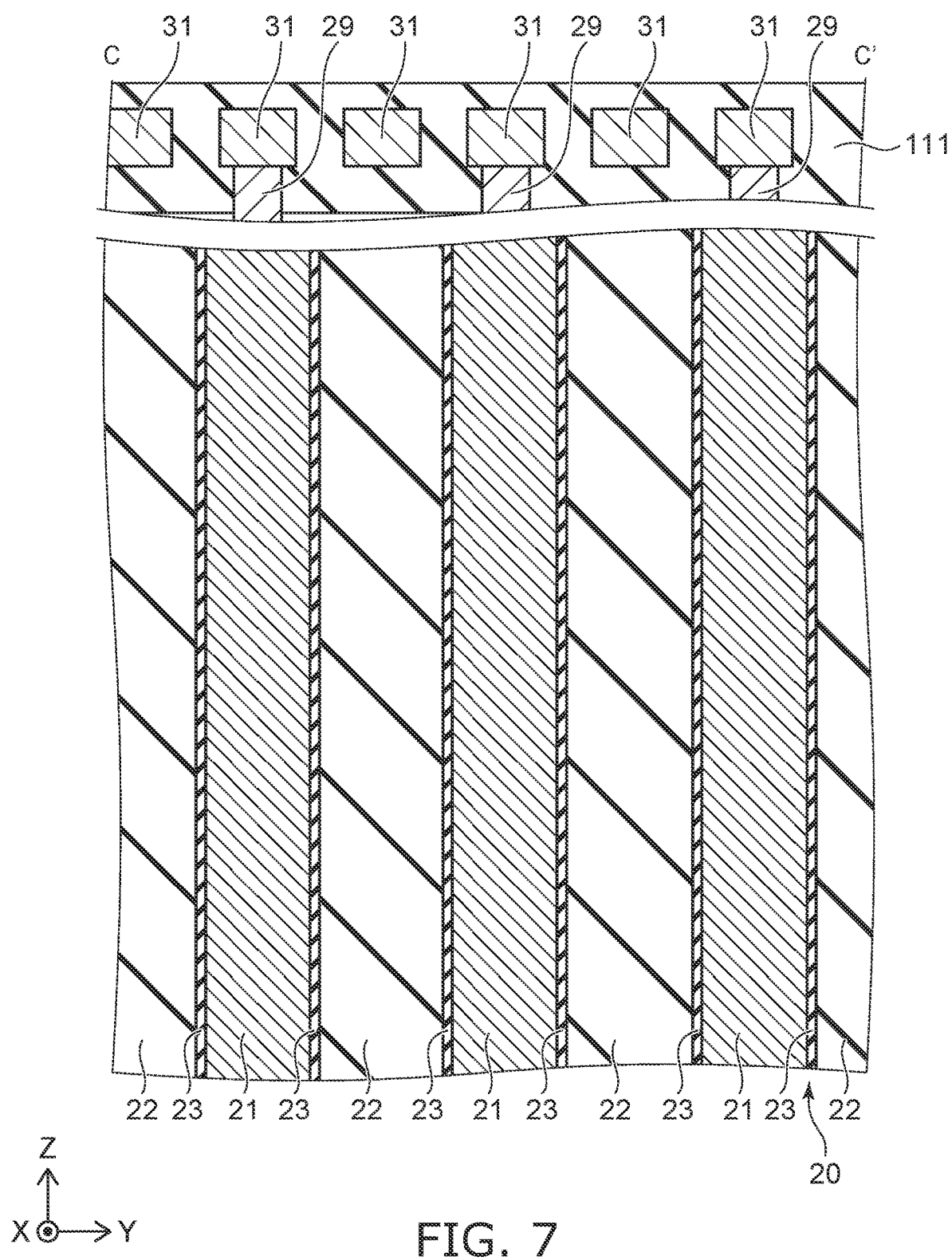
FIG. 7 is a cross-sectional view along line C-C' shown in FIG. 4.

FIG. 7 is a cross-sectional view along line C-C' shown in FIG. 4.

In the memory array portion 133 of the memory device 1 as shown in FIGS. 3A, 3B, 4, 5, 6, and 7, multiple source-drain structure bodies 10 and multiple gate structure bodies 20 are alternately arranged one at a time along the X-direction on an inter-layer insulating film 111a. The inter-layer insulating film 111a is part of the lower portion of the inter-layer insulating film 111. The source-drain structure bodies 10 and the gate structure bodies 20 each have a plate shape spreading along the YZ plane. A memory structure body 30 includes the multiple source-drain structure bodies 10 and the multiple gate structure bodies 20.

The source-drain structure bodies 10 each include multiple unit stacked bodies 11 and multiple insulating bodies 12 alternately arranged one on top of another along the Z-direction. The insulating body 12 is in the form of a horizontal strip extending in the Y-direction. The insulating body 12 is made of an insulating material, e.g., silicon oxycarbide (SiOC).

A source line 13, a source layer 14, an insulating layer 15, a drain layer 16, and a bit line (a drain line) 17 are stacked in this order upward from below in each unit stacked body 11. The source line 13, the source layer 14, the insulating layer 15, the drain layer 16, and the bit line 17 each have a form of a horizontal strip extending in the Y-direction. Accordingly, the multiple bit lines 17 are arranged along the X-direction and the Z-direction in the entire memory structure body 30 to form a three-dimensional memory array structure. This is similar for the source line 13, the source layer 14, the insulating layer 15, and the drain layer 16 as well.

The source line 13 and the bit line 17 are made of metals. For example, the source line 13 and the bit line 17 are formed using a refractory metal layer with a metal liner formed thereon. The refractory metal layer may include a layer of tungsten (W), tungsten nitride (WN), molybdenum (Mo), or titanium tungsten alloy (TiW). The metal liner layer may include a layer of titanium (Ti), titanium nitride (TiN), tantalum (Ta) or tantalum nitride (TaN). The source layer 14 and the drain layer 16 are semiconductor layers and are made of, for example, n+-type amorphous silicon (aSi). The source layer 14 contacts the source line 13, and the drain layer 16 contacts the bit line 17. The insulating layer 15 is formed of an insulating material, e.g., silicon oxide. The insulating layer 15 contacts the source layer 14 and the drain layer 16.

Referring to FIG. 4, channel layers 18 are provided on the two side surfaces of the stacked body made of the source line 13, the source layer 14, the insulating layer 15, the drain layer 16, and the bit line 17 facing the two X-direction sides. The channel layer 18 is a semiconductor layer and is made of, for example, p+-type amorphous silicon. The channel layer 18 contacts the source line 13, the source layer 14, the insulating layer 15, the drain layer 16, and the bit line 17.

The gate structure bodies 20 each include multiple local word lines 21 and multiple insulating members 22 alternately arranged along the Y-direction. The local word line 21 and the insulating member 22 have columnar configurations extending in the Z-direction. The insulating member 22 is made of an insulating material, e.g., silicon oxide.

The local word lines 21 in two adjacent gate structure bodies 20 of a source-drain structure body 10 are positioned staggered from each other in the Y-direction. In other words, when viewed from the Z-direction, the local word lines 21 in the multiple gate structure bodies 20 are arranged in a staggered configuration. When viewed from the X-direction, the local word lines 21 that belong to one gate structure body 20 and the local word lines 21 that belong to an adjacent gate structure body 20 may have an overlap in the Y-direction or the local word lines 21 may be spaced apart in the Y-direction without any overlap. A charge storage film 23 is formed on each local word line 21. In particular, the charge storage film 23 is formed between a respective local word line 21 and a respective channel layer. Chargers are stored or removed from the charge storage film to realize the memory function of the memory array.

The local word line 21 is made of a metal. For example, the local word line 21 is formed using a refractory metal layer with a metal liner formed thereon. The refractory metal layer may include a layer of tungsten (W), tungsten nitride (WN), molybdenum (Mo), titanium tungsten alloy (TiW) or copper (Cu). The metal liner layer may include a layer of titanium (Ti), titanium nitride (TiN), tantalum (Ta) or tantalum nitride (TaN). The charge storage film 23 may include a tunneling layer, a charge storage layer and a blocking layer. The tunneling layer may include one or more of silicon oxide (SiOx), silicon nitride (SiN), silicon oxynitride (SiON), aluminum oxide (AlOx), hafnium oxide (HfOx), zirconium oxide (ZrOx), hafnium silicon oxide (HfSixOy), hafnium zirconium oxide (HfZrO), or combination. The charge storage layer may include silicon nitride (SiN), hafnium oxide (HfOx), or hafnium silicon oxynitride (HfSiON). The blocking layer may include silicon oxide, aluminum oxide, or both.

For example, the channel layer 18 of the source-drain structure body 10 contacts the insulating member 22 and the charge storage film 23 of the gate structure body 20. In other words, for example, the source-drain structure body 10 contacts the gate structure body 20.

Thereby, a memory cell 40 that has a MOSFET structure is configured at each most proximate portion between the unit stacked bodies 11 extending in the Y-direction and the local word lines 21 extending in the Z-direction. The memory cell 40 has different thresholds according to whether or not a charge is stored in the charge storage layer in the charge storage film 23. Therefore, information can be stored by the charge entering and exiting the charge storage layer. In one example embodiment, the charge storage layer of the charge storage film 23 in which the charge is stored is a silicon nitride layer, but the present invention is not limited thereto. For example, the charge storage layer may be formed of a material such as hafnium silicon oxide (HfSiO), zirconium oxide (ZrO), hafnium aluminum oxide (HfAlO), silicon oxynitride (SiON), silicon nitride (SiN), hafnium oxide (HfOx), hafnium silicon oxynitride (HfSiON), etc.

Returning to FIG. 2, the two Y-direction end portions of the memory structure body 30 include staircase structures, and the upper surface of each step includes the bit line 17. Each bit line 17 is connected to a contact at the upper surface of the step. It is sufficient for the memory structure body 30 to have a configuration in which each bit line 17 can be connected to the peripheral circuit, and it is not always necessary for the end portions to have staircase structures.

Multiple global word lines 31 are provided on the memory structure body 30. The multiple global word lines 31 are arranged along the Y-direction, and each global word line 31 extends in the X-direction. In the present embodiment, the global word line 31 has a shape that corresponds to the position of a reference bit line 17r, as will be described in more details below.

First, the general configuration of the global word line 31 will be described.

Referring to FIG. 4, the width, i.e., the length in the Y-direction, of each global word line 31 is about equal to or less than the length in the Y-direction of the local word line 21. Each global word line 31 passes through the region directly above the local word lines 21 belonging to every other gate structure body 20 and is connected to these local word lines 21 via plugs 29 (FIG. 5). In other words, a first global word line 31 is connected to the local word lines 21 belonging to the odd-numbered gate structure bodies 20 counting from one X-direction end portion of the memory structure body 30, and the global word line 31 next to the first global word line 31 is connected to the local word lines 21 belonging to the even-numbered gate structure bodies 20.

The relationship between the reference bit line and the global word line will now be described.

Figure 8:
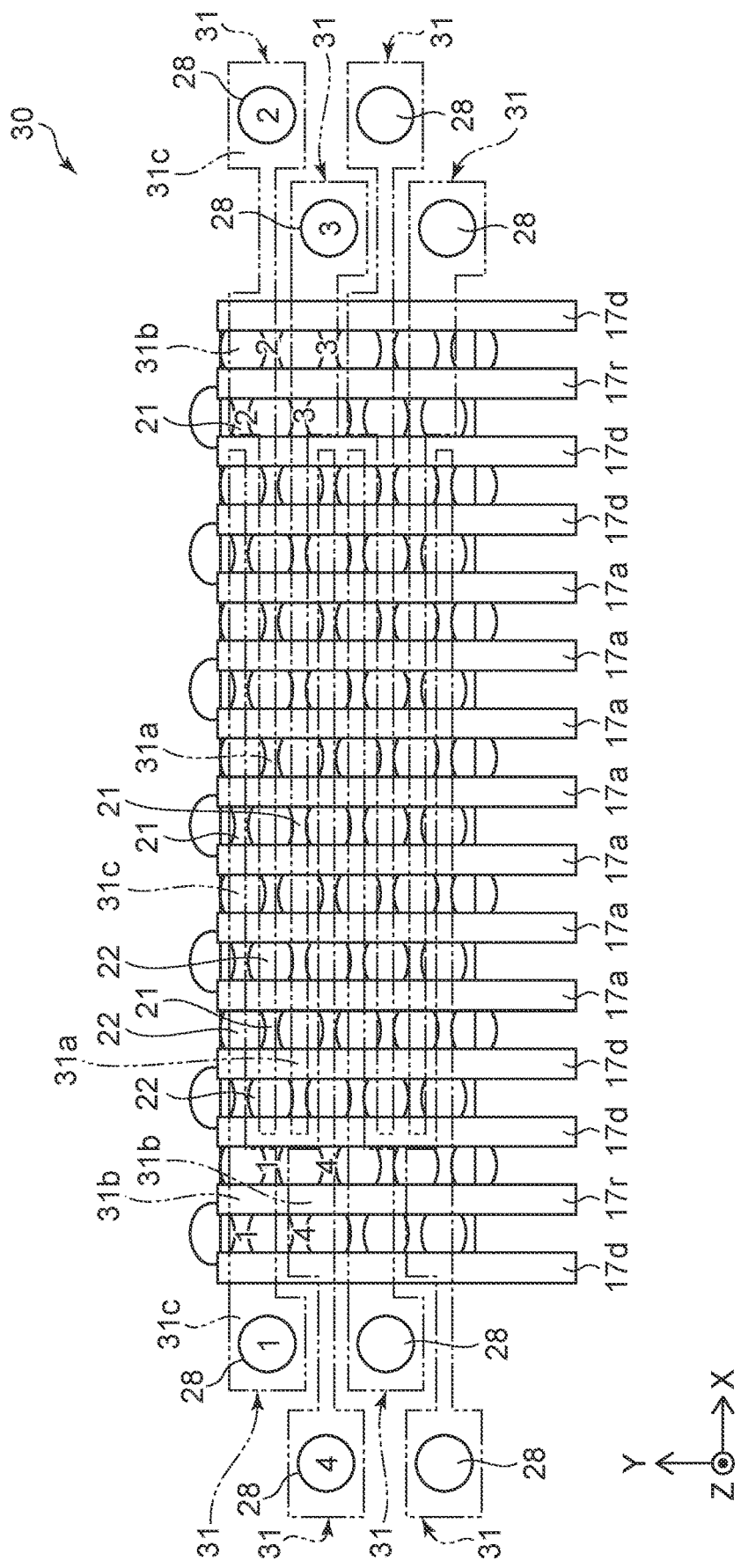
FIG. 8 is a plan view showing a memory structure body and global word lines of the first embodiment.

FIG. 8 is a plan view showing the memory structure body and the global word lines of the first embodiment.

Four global word lines 31 are marked with the numerals "1" to "4" in FIG. 8 to assist understanding. Also, eight local word lines 21 are marked, two each, with the numerals "1" to "4". As described below, the global word line 31 and the local word lines 21 that are marked with the same numeral are connected to each other. The charge storage film 23 is not shown in FIG. 8 to simplify the discussion.

As shown in FIG. 8, the multiple bit lines 17 include three types of bit lines: "reference bit line 17r", "dummy bit line 17d", and "active bit line 17a."

Bit lines 17 that are associated with at least one source-drain structure body 10 of the multiple source-drain structure bodies 10 provided in the memory structure body 30 are used as the reference bit lines 17r. In the present embodiment, the reference bit lines 17r are located at the vicinities of the two X-direction end portions of the memory structure body 30. The unit stacked body 11 that includes the reference bit line 17r does not function as a memory cell. Hereinbelow, the unit stacked body 11 that includes the reference bit line 17r is called a "dummy memory cell 40d". The reference bit line 17r provides a reference potential when reading data from the memory cell 40 connected to the active bit line 17a.

The bit lines 17 that are located at the periphery of the reference bit line 17r are used as the dummy bit lines 17d. The unit stacked body 11 that includes the dummy bit line 17d does not function as a memory cell. The dummy bit line 17d may not be provided, or the dummy bit line 17d may be at a position other than the periphery of the reference bit line 17r.

The bit lines 17 other than the reference bit line 17r and the dummy bit line 17d are used as the active bit lines 17a. In the present embodiment, the active bit lines 17a are located at portions other than the two X-direction end portions of the memory structure body 30. The unit stacked body 11 that includes the active bit line 17a functions as memory cells.

Each respective source-drain structure body 10 is associated with a given type of bit lines 17. In other words, all of the multiple bit lines 17 arranged in the Z-direction that are associated with one source-drain structure body 10 are of the same type, being one of the reference bit lines 17r, the dummy bit lines 17d, or the active bit lines 17a.

Each global word line 31 is formed as a continuous body including a basic portion 31a, a wide portion 31b, and a pad portion 31c. The basic portion 31a has the general configuration of the global word line 31 described above. In other words, the width of the basic portion 31a is about equal to or less than the length in the Y-direction of the local word line 21. The basic portion 31a of each global word line 31 is located in the regions directly above the local word lines 21 adjacent or interposed between the active bit lines 17a. The basic portion 31a is connected to the multiple local word lines 21 that are arranged in one column along the X-direction and belong to every other gate structure body 20.

The wide portion 31b of each global word line 31 is located in a region directly above the reference bit line 17r and the two local word lines 21 having the reference bit line 17r interposed therebetween. The width, i.e., the length in the Y-direction, of the wide portion 31b is greater than the width of the basic portion 31a. Thereby, the wide portion 31b is connected to the two local word lines 21 that are arranged in a direction oblique to the X-direction with the reference bit line 17r interposed therebetween. In other words, the wide portion 31b is connected to two staggered local word lines 21 formed across the reference bit line 17r interposed therebetween.

By such a configuration as shown in FIG. 8, the wide portion 31b of one global word line 31 marked with the numeral "1" is connected to two local word lines 21 marked with the numeral "1". The two local word lines 21 have the reference bit line 17r interposed. This is similar for the global word lines 31 and the local word lines 21 marked with the numerals "2" to "4" as well.

The pad portion 31c of each global word line 31 is located at the end portion of the global word line 31 and is located at the outer X-direction side of the memory structure body 30 when viewed from the Z-direction. In one embodiment, the width of the pad portion 31c is greater than the width of the wide portion 31b. In other embodiments, the width of the pad portion 31c may not be greater than the width of the wide portion 31b and may be, for example, equal to the width of the wide portion 31b. A contact 28 is connected to the pad portion 31c, and the pad portion 31c is connected to the peripheral circuit via the contact 28.

As described above, the basic portion 31a of the global word line 31 is located at the vicinities of the regions directly above the active bit lines 17a, and the active bit lines 17a are located at the X-direction central portion of the memory structure body 30. The wide portion 31b is located at the vicinity of the region directly above the reference bit line 17r, and the reference bit line 17r is located at the X-direction end portion of the memory structure body 30. The pad portion 31c is located at the outer X-direction side of the region directly above the memory structure body 30. Therefore, in each global word line 31, the wide portion 31b is located between the basic portion 31a and the pad portion 31c.

In the first and fourth global word lines 31 counting from one Y-direction end, the wide portion 31b and the pad portion 31c are located at one X-direction end (the left side of FIG. 8); and in the second and third global word lines 31, the wide portion 31b and the pad portion 31c are located at the other X-direction end (the right side of FIG. 8). Combinations of the four global word lines 31 and allocation of the wide portion 31b and the pad portion 31c (the left side or the right side of FIG. 8) may have other arrangement. In the present embodiment, the four global word lines 31 that are consecutively arranged are included in one basic unit, and the basic unit may be repeatedly arranged along the Y-direction across the memory structure body.

Because the width of the wide portion 31b is greater than the width of the basic portion 31a, the number of the global word lines 31 arrangeable in the Y-direction in the region where the wide portion 31b is located is about half of that in the region where the basic portion 31a is located. For example, as shown in FIG. 8, the global word line 31 marked with the numeral "2" and the global word line 31 marked with the numeral "3" cannot be disposed between the wide portion 31b of the global word line 31 marked with the numeral "1" and the wide portion 31b of the global word line 31 marked with the numeral "4". The basic portion 31a of the global word line 31 marked with the numeral "2" is terminated before reaching the wide portion 31b of the global word line 31 marked with the numeral "1"; and the basic portion 31a of the global word line 31 marked with the numeral "3" is terminated before reaching the wide portion 31b of the global word line 31 marked with the numeral "4".

Similarly, other global word lines 31 cannot be disposed between the wide portion 31b of the global word line 31 marked with the numeral "2" and the wide portion 31b of the global word line 31 marked with the numeral "3". Therefore, the basic portion 31a of the global word line 31 marked with the numeral "1" is terminated before reaching the wide portion 31b of the global word line 31 marked with the numeral "2"; and the basic portion 31a of the global word line 31 marked with the numeral "4" is terminated before reaching the wide portion 31b of the global word line 31 marked with the numeral "3". Thus, the basic portion 31a of each global word line 31 must be terminated before reaching the wide portion 31b of the global word line 31 next to that global word line 31. Accordingly, if the basic portions 31a of all of the global word lines 31 are located over the regions directly above all of the active bit lines 17a, the wide portions 31b can be located only at the two X-direction end portions of the memory structure body 30.

The local word lines 21 which belong two gate structure bodies 20 having the reference bit line 17r located at left side of FIG. 8 interposed are connected to the wide portions 31b of the global word lines 31 marked with the numerals "1" and "4", but not connected to the global word lines 31 marked with the numerals "2" and "3". On the other hand, the local word lines 21 which belong two gate structure bodies 20 having the reference bit line 17r located at right side of FIG. 8 interposed are connected to the wide portions 31b of the global word lines 31 marked with the numerals "2" and "3", but not connected to the global word lines 31 marked with the numerals "1" and "4".

In this way, each global word line 31 is connected to all of the local word lines 21 that are formed in a respective column in the X-direction and one additional local word line 21 that is formed in an adjacent column. In particular, each global word line 31 is connected at the wide portion 31b to a local word line 21 belonging to one column and also to a local word line belonging to an adjacent column. The two local word lines connected by the wide portion 31b are formed on the two sides of the referenced bit line 17r and are staggered in the Y-direction.

The relationship between the bit lines and the sense amplifiers will now be described.

Figure 9:
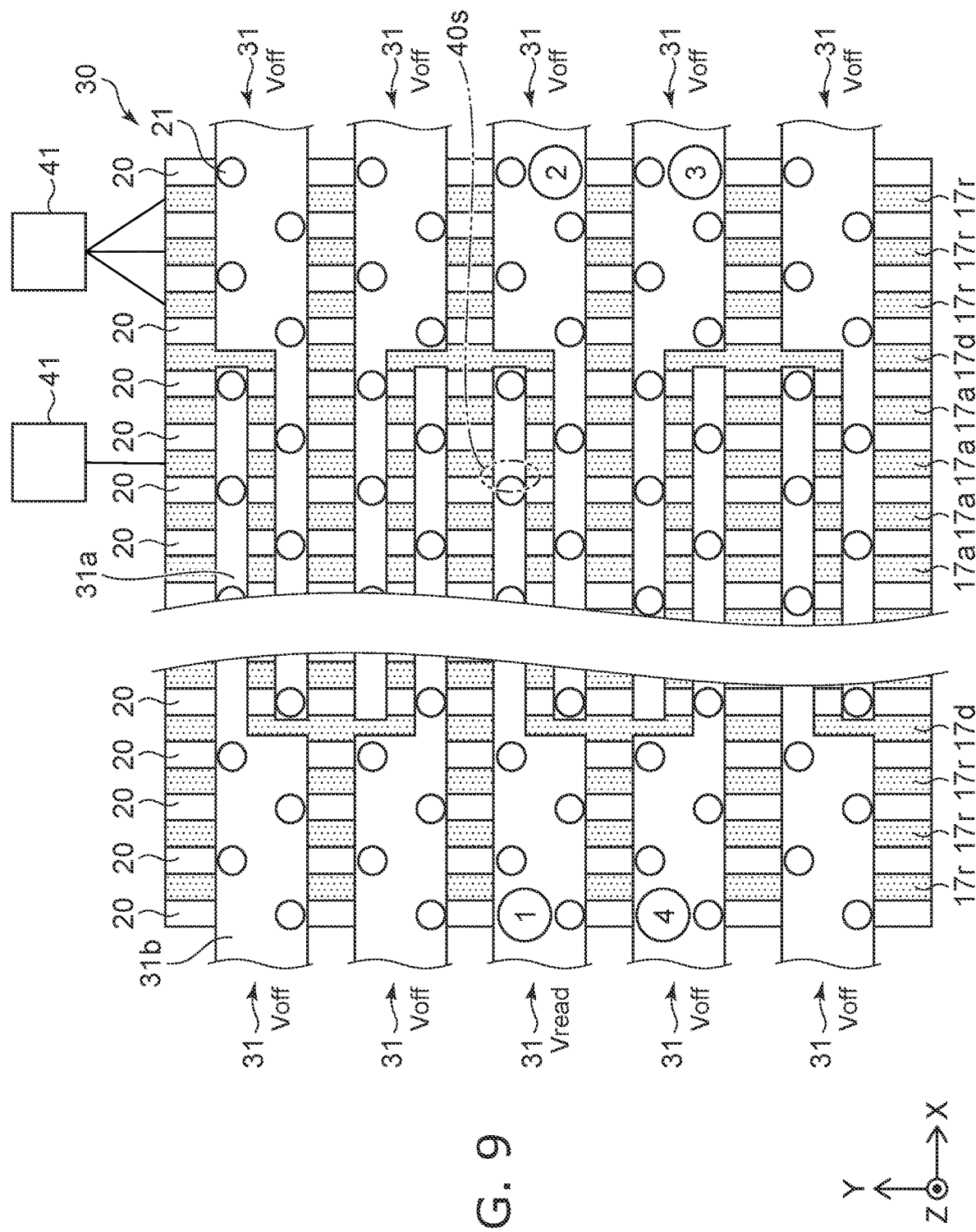
FIG. 9 shows bit lines and sense amplifiers of the first embodiment.

FIG. 9 shows the bit lines and the sense amplifiers of the first embodiment.

Figure 10:
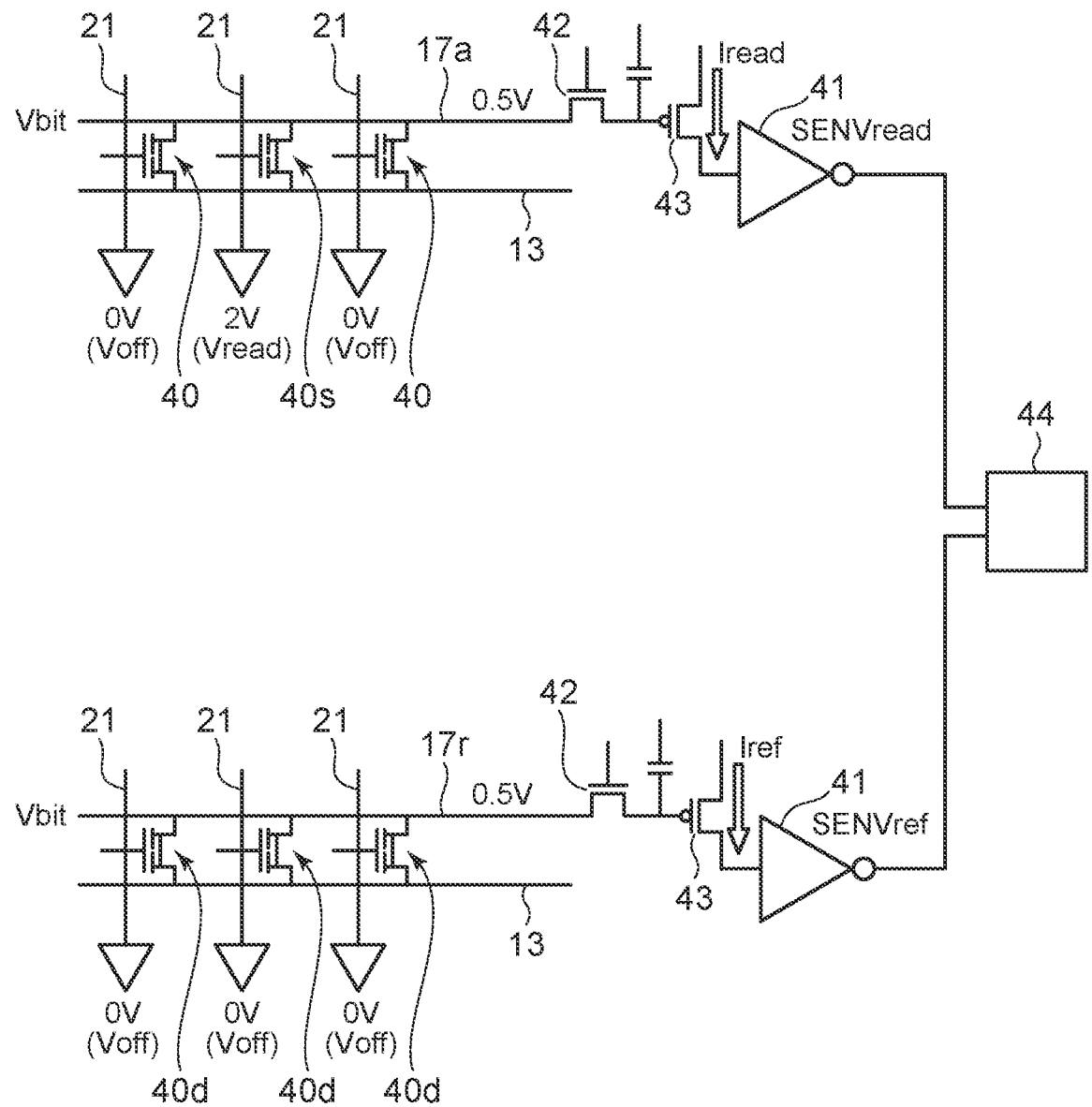
FIG. 10 is a circuit diagram showing local word lines, memory cells, the bit lines, and the sense amplifiers of the first embodiment.

FIG. 10 is a circuit diagram showing the local word lines, the memory cells, the bit lines, and the sense amplifiers of the first embodiment.

In the example shown in FIG. 8, one reference bit line 17r is provided on each of the left and right sides. In the example shown in FIG. 9, three reference bit lines 17r are provided on each of the left and right sides. Thereby, in the example shown in FIG. 9, the wide portion 31b of the global word line 31 is located at region directly above three source-drain structure bodies 10 and four gate structure bodies 20. The three reference bit lines 17r belong to the three source-drain structure bodies 10. The four gate structure bodies 20 are located on both side of each of the three source-drain structure bodies 10. The wide portion 31b of the global word line 31 is connected to the local word lines 21 which belong to the four gate structure bodies 20. In FIG. 9, the bit lines 17 are shown with a dotted pattern for convenience of illustration.

As shown in FIGS. 9 and 10, the bit lines 17 extend out at the staircase structures in the Y-direction end portions of the memory structure body 30 and are connected to sense amplifiers 41. A sense amplifier 41 is provided for the multiple bit lines 17; and each bit line 17 is switchably connected to a respective sense amplifier 41 (the switching element is not illustrated in FIGS. 9 and 10 for simplicity). In other embodiments, the sense amplifiers 41 may be provided respectively for each of the bit lines 17. In FIGS. 9 and 10, only two sense amplifiers 41 are shown for convenience of illustration.

A bit line driver 42 and a transistor 43 are provided between the bit line 17 and the sense amplifier 41. The bit line driver 42 is a switching element such as a MOSFET, etc. The transistor 43 is, for example, a PMOS (p-type Metal-Oxide-Semiconductor) transistor. The bit line driver 42 is connected between the bit line 17 and the gate of the transistor 43. The drain of the transistor 43 is connected to the input terminal of the sense amplifier 41. The output terminal of the sense amplifier 41 is connected to a comparison circuit 44. For example, the sense amplifier 41, the bit line driver 42, the transistor 43, and the comparison circuit 44 are located in the peripheral circuit formed in the circuit element formation layer 131 and the lower layer interconnect layer 132 (referring to FIG. 2).

An operation of the memory device 1 according to the present embodiment will now be described.

As shown in FIGS. 9 and 10, one memory cell 40 of which the value is to be read is selected from the multiple memory cells 40. The selected memory cell 40 is taken as a "memory cell 40s".

First, all of the source lines 13 are set to an electrically floating state after applying a constant potential. Then, a read potential Vread is applied to the global word line 31 that is connected to the memory cell 40s. Thereby, the read potential Vread is applied to the local word line 21 connected to the memory cell 40s via the basic portion 31a of the global word line 31. In description below, memory cell 40s is connected to the global word line 31 marked with the numeral "1". Thus, the read potential Vread is applied to the global word line 31 marked with the numeral "1". On the other hand, an off-potential Voff is applied to the global word lines 31 other than the global word line 31 connected to the memory cell 40s. Namely, the off-potential Voff is applied to the global word lines 31 marked with the numerals "2" to "4". Therefore, the off-potential Voff is applied to the local word lines 21 marked with the numerals "2" to "4" via the wide portion 31b of the global word lines 31 marked with the numerals "2" to "4".

A bit line potential Vbit is applied to the active bit line 17a connected to the memory cell 40s. The bit line potential Vbit is applied to the reference bit line 17r as well. A potential is not applied to the other active bit lines 17a and dummy bit lines 17d.

The read potential Vread is a potential such that the conducting state of the memory cell 40 is different according to the value stored in the memory cell 40. The bit line potential Vbit is a potential such that a current flows between the bit line 17 and the source line 13 when the memory cell 40 is in the on-state. The off-potential Voff is a potential such that the memory cell 40 is set to the off-state regardless of the value of the memory cell 40. As an example in the present embodiment, the read potential Vread is taken to be 2 V, the bit line potential Vbit is taken to be 0.5 V, and the off-potential Voff is taken to be 0 V.

Thereby, when the memory cell 40s is in the off-state, a current does not flow between the source line 13 and the active bit line 17a connected to the memory cell 40s. On the other hand, when the memory cell 40s is in the on-state, a current flows between the source line 13 and the active bit line 17a connected to the memory cell 40s, and the gate potential that is applied to the transistor 43 decreases. Thereby, a read current Iread flows into the sense amplifier 41. In this way, when the memory cell 40s is in the on-state, electrical charge from the active bit line 17a connected to the memory cell 40s flows into the source line 13 via the memory cell 40s to change the potential of the active bit line 17a. A state of the memory cell 40s is estimated by detecting the change of the potential of the active bit line 17a.

Other than the current that flows in the active bit line 17a via the memory cell 40s that is in the on-state, a leakage current flows in the local word lines 21 via the charge storage films 23 of all of the memory cells 40 connected to the active bit line 17a. The leakage current is called a "gate leakage current".

As described above, the memory cell 40s is connected to the global word lines 31 marked with the numeral "1". The local word lines 21 which belong to the gate structure bodies 20 associated with the reference bit line 17r located at right side of FIGS. 8 and 9 are not connected to the global word lines 31 marked with the numeral "1". That is, the reference bit line 17r at right-hand-side is not connected to the global word line 31 associated with the memory cell 40s.

The bit line potential Vbit is applied to reference bit lines 17r at right-hand-side, on the other hand, the off-potential Voff is applied to the local word lines 21 having the reference bit line 17r interposed. Thus, the dummy memory cells 40d do not conduct. Accordingly, only the gate leakage current flows in the reference bit line 17r at right-hand-side. Therefore, the gate voltage of the transistor 43 connected to the reference bit line 17r is a voltage potential determined by the leak amount via the dummy memory cells 40d. As a result, a reference current Iref flows into the sense amplifier 41 connected to the reference bit line 17r.

Then, the comparison circuit 44 determines the value of the memory cell 40s by comparing an output SENVread of the sense amplifier 41 connected to the selected memory cell 40s and an output SENVref of the sense amplifier 41 connected to the dummy memory cells 40d.

At this time, the off-potential Voff is applied to the local word lines 21 having the reference bit line 17r at right-hand-side interposed because the local word lines 21 are connected to the wide portions 31b of global word lines 31 marked with the numerals "2" to "3", but not connected to the global word line 31 marked with the numeral "1". Thereby, the two dummy memory cells 40d that are connected to the reference bit line 17r can be reliably set to the off-state, and the flow of a current from the reference bit line 17r to the source line 13 can be effectively suppressed. Thereby, the potential of the reference bit line 17r is stabilized, and the accuracy of the read operation of the selected memory cell 40s is increased.

When the value is read from the memory cell 40 connected to the global word lines 31 marked with the numeral "4", the reference bit line 17r that is not interposed between the local word lines 21 connected to the global word lines 31 marked with the numeral "4", that is, the reference bit line 17r at right-hand-side is used. On the other hand, when the value is read from the memory cell 40 connected to the global word lines 31 marked with the numeral "2" or "3", the reference bit line 17r at left-hand-side is used.

A method for manufacturing the memory device according to the present embodiment will now be described.

Although several methods may be considered for the method for manufacturing the memory device described above, a method for making the global word lines by a sidewall double patterning process will be described in the present embodiment, in order to increase memory density of the memory devices. On the other hand, a method for making the global word lines by using single patterning as shown in FIG. 8 may be considered.

FIGS. 11 to 14 are plan views showing the method for manufacturing the memory device according to the first embodiment.

FIGS. 15A to 17C are cross-sectional views showing the method for manufacturing the memory device according to the first embodiment.

Because the global word lines 31 are not yet formed in FIGS. 11 to 14, the numerals "1" to "4" that mark the global word lines 31 in FIG. 8 are placed on the contacts 28 that are connected to these global word lines 31.

FIGS. 15A to 17C illustrate the region where the basic portions 31a of the global word lines 31 are formed and the region where the pad portion 31c is formed next to each other; FIGS. 15A to 17C are illustrative only and do not correspond exactly to the plan views shown in FIGS. 11 to 14.

First, the semiconductor substrate 100 is prepared as shown in FIG. 2. Then, the circuit element formation layer 131 is formed in the semiconductor substrate 100 and above the semiconductor substrate 100, and the lower layer interconnect layer 132 is formed on the circuit element formation layer 131.

Then, the memory structure body 30 is made as shown in FIGS. 3A and 3B. The inter-layer insulating film 111 is formed at the periphery of the memory structure body 30.

Figure 15A:
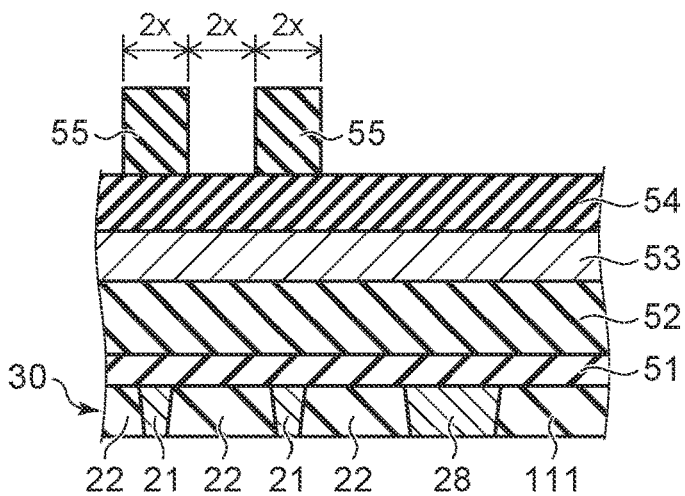
FIGS. 15A, 15B, 15C, 15D, 16A, 16B, 16C, 16D, 17A, 17B and 17C are cross-sectional views showing the method for manufacturing the memory device according to the first embodiment.

Continuing as shown in FIG. 15A, a silicon nitride layer 51, a silicon oxide layer 52, an amorphous silicon layer 53, and a silicon oxide layer 54 are formed in this order on the memory structure body 30 and on the inter-layer insulating film 111.

Figure 11:
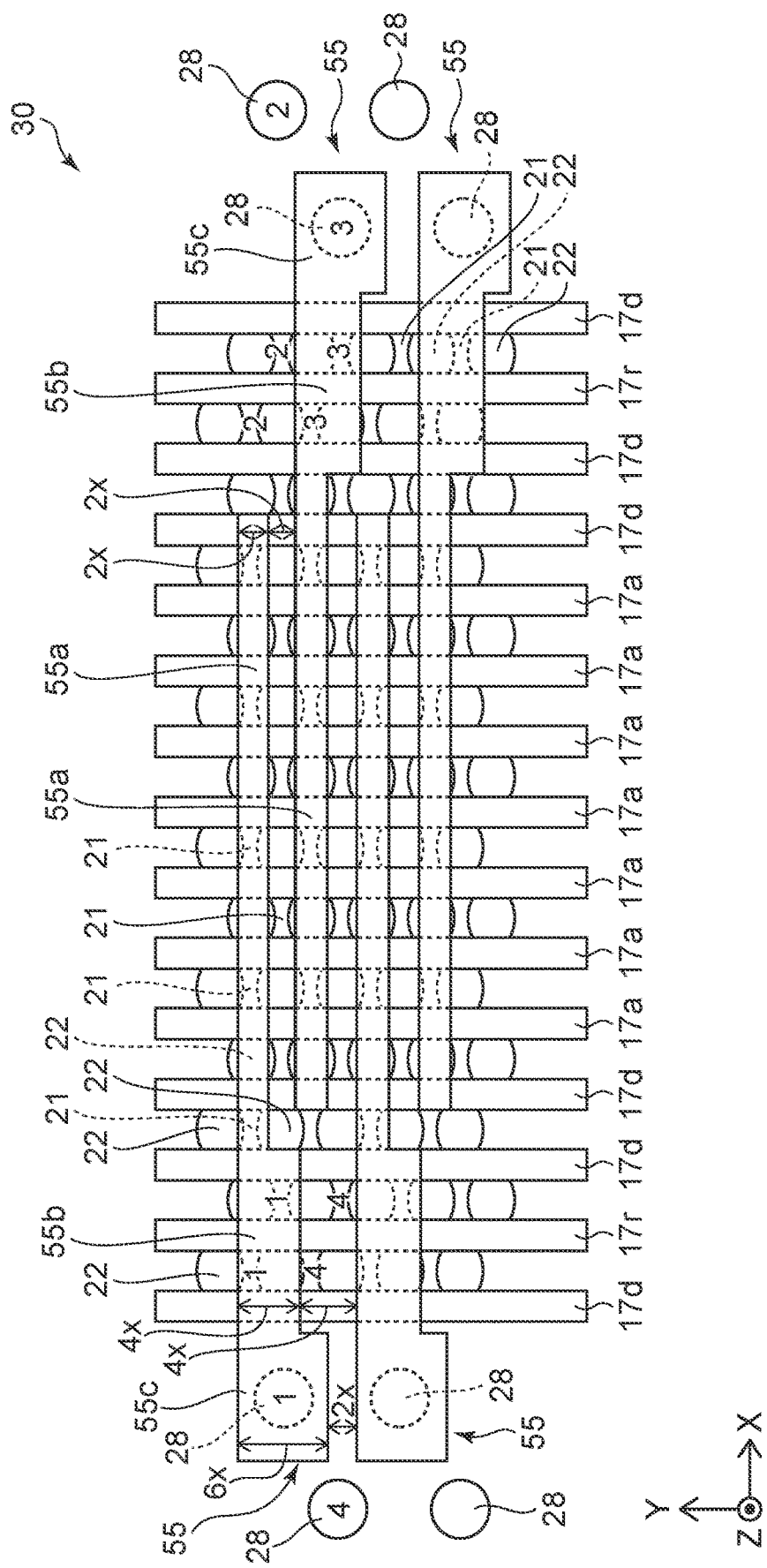
FIGS. 11, 12, 13 and 14 are plan views showing a method for manufacturing the memory device according to the first embodiment.

Then, as shown in FIGS. 11 and 15A, a pattern 55 is formed by performing a first lithography step. The pattern 55 may be, for example, a resist pattern or may be a pattern formed by transferring a resist pattern onto another material.

The pattern 55 covers the region where every other global word line 31 is formed in a subsequent process. In the example shown in FIG. 11, the pattern 55 includes the region where the odd-numbered global word lines 31 are formed but does not include the region where the even-numbered global word lines 31 are formed. The local word lines 21 that are connected to the same global word line 31 in the memory device 1 after completion are either covered with the same pattern 55 or are not covered with any pattern 55.

A first portion 55a, a second portion 55b, and a third portion 55c are continuous in the pattern 55. The width, i.e., the length in the Y-direction, of the first portion 55a is set to 2x, where x is the half pitch of the final global word lines (a width of the global word line 31a along the Y-direction in FIG. 8); and the distance between the first portions 55a adjacent to each other in the Y-direction also is set to 2x. Accordingly, the arrangement interval of the first portion 55a is 4x. The width of the second portion 55b is set to 4x; and the distance between the second portions 55b adjacent to each other in the Y-direction also is set to 4x. Accordingly, the arrangement interval of the second portion 55b is 8x.

The width of the third portion 55c is set to 6×; and the distance between the third portions 55c adjacent to each other in the Y-direction is set to 2×. Accordingly, the arrangement interval of the third portion 55c is 8×. In some embodiments, the width of the pad portion 31c is set to be equal to the width of the wide portion 31b in the global word line 31 after formation, the width of the third portion 55c is set to 4×; and the distance between the third portions 55c adjacent to each other in the Y-direction also is set to 4×. That is, the width of the third portion 55c is, for example, adjustable from 4× to 6×. The case where the width of the third portion 55c is set to 6× will now be described.

Figure 15B:
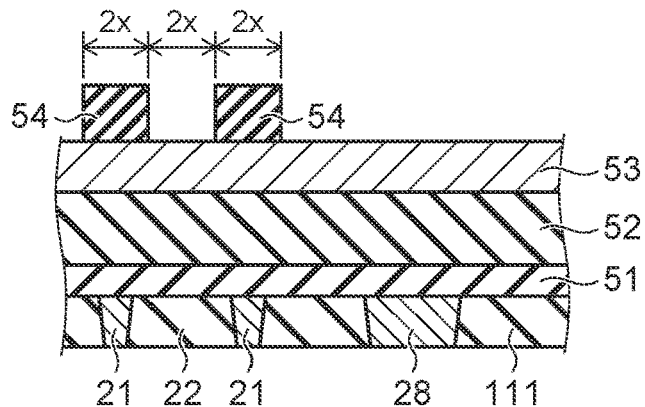

Then, as shown in FIG. 15B, anisotropic etching such as RIE (Reactive Ion Etching), etc., of the silicon oxide layer 54 is performed using the pattern 55 as a mask and the amorphous silicon layer 53 as a stopper. The silicon oxide layer 54 is selectively removed thereby; the first portion 55a of the pattern 55 is transferred onto a first portion 54a of the silicon oxide layer 54; the second portion 55b of the pattern 55 is transferred onto a second portion 54b of the silicon oxide layer 54; and the third portion 55c of the pattern 55 is transferred onto a third portion 54c of the silicon oxide layer 54. The patterned silicon oxide layer 54 is used as the mandrel members of the sidewall process described below.

Figure 12:
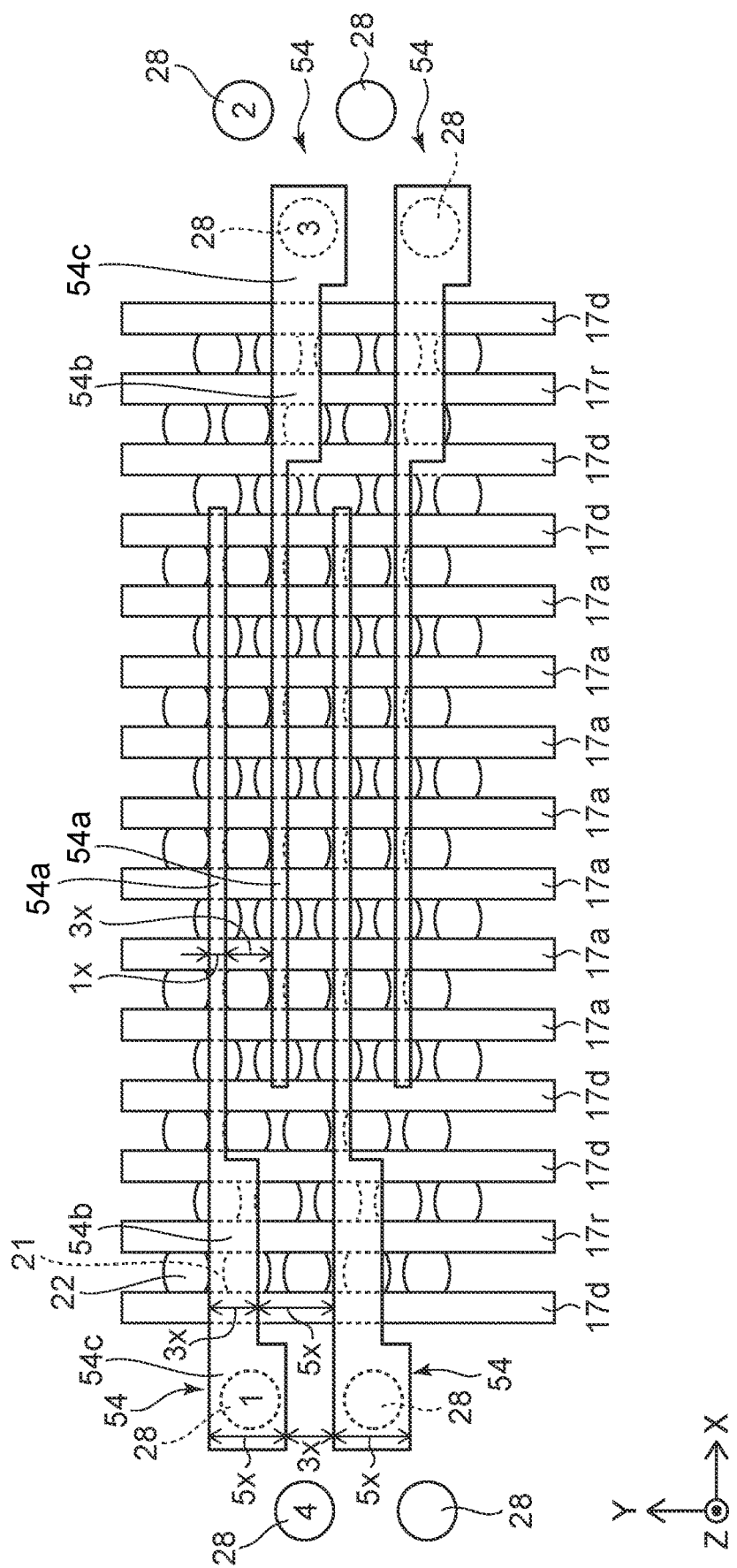
Figure 15C:
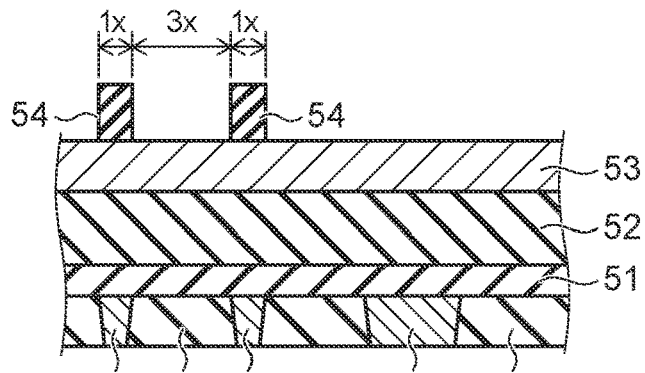

Then, the silicon oxide layer 54 is slimmed as shown in FIGS. 12 and 15C. For example, the slimming is performed by wet etching using DHF (Diluted Hydrofluoric Acid). The slimming amount is set to 0.5× per side surface. Thereby, the width of the first portion 54a of the silicon oxide layer 54 is reduced from 2× to 1×; and the distance between the first portions 54a is increased from 2× to 3×. The width of the second portion 54b of the silicon oxide layer 54 is reduced from 4× to 3×; and the distance between the second portions 54b is increased from 4× to 5×. The width of the third portion 54c of the silicon oxide layer 54 is reduced from 6× to 5×; and the distance between the third portions 54c is increased from 2× to 3×.

Figure 15D:
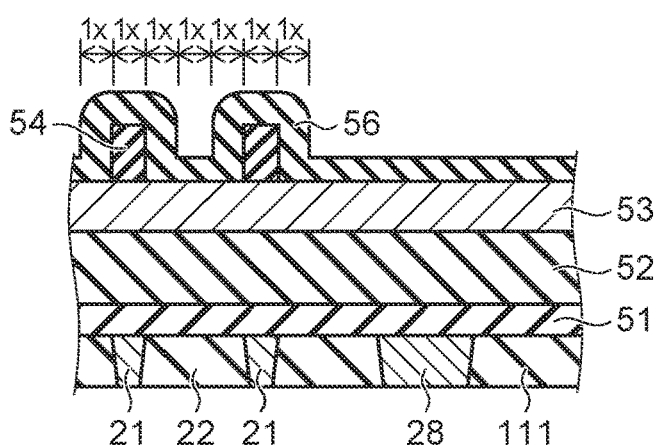

Continuing, a silicon nitride layer 56 is deposited as shown in FIG. 15D. The thickness of the silicon nitride layer 56 is about 1×. The shape of the silicon nitride layer 56 reflects the pattern of the silicon oxide layer 54. The silicon nitride layer 56 does not completely fill the gap between the pattern of the silicon oxide layer 54.

Figure 13:
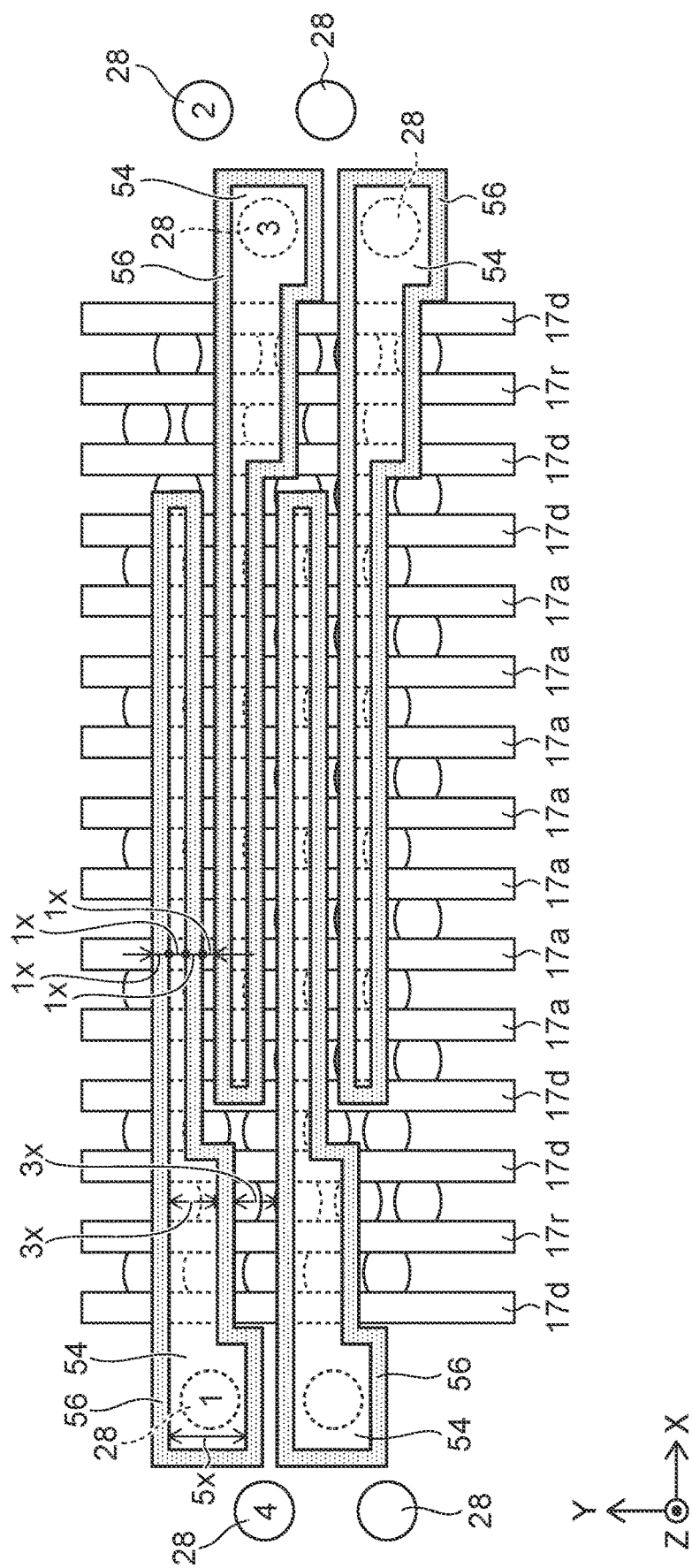
Figure 16A:
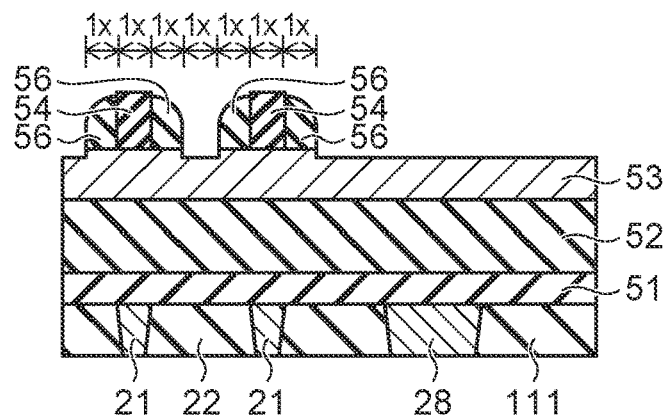

Then, as shown in FIGS. 13 and 16A, anisotropic etching such as RIE, etc., of the silicon nitride layer 56 is performed. The etching amount is slightly greater than about 1×. The portions of the silicon nitride layer 56 other than the portion located on the sidewall surface of the silicon oxide layer 54 are removed thereby. As a result, the silicon nitride layer 56 remains in a frame shape along the periphery of the silicon oxide layer 54 and becomes a sidewall structure. The width of each sidewall portion of the silicon nitride layer 56 is about 1×.

Figure 16B:
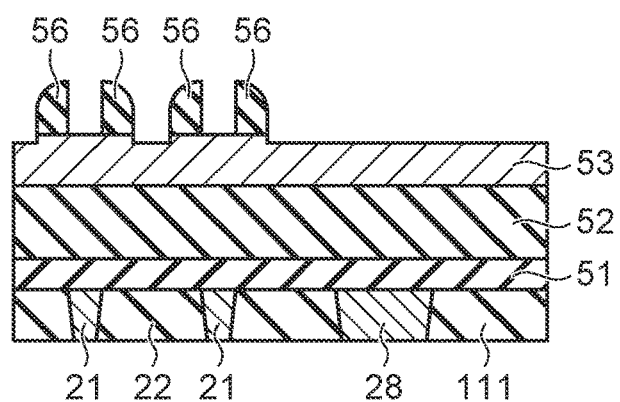

Continuing as shown in FIG. 16B, the silicon oxide layer 54 that is used as the mandrel member is removed. For example, the removal is performed by wet etching using DHF. At this time, the silicon nitride layer 56 that is the sidewall is not removed and remains in a frame shape. In the present description, the frame shape of the silicon nitride layer 56 refers to the silicon nitride layer forming a closed loop frame around the silicon oxide layer 54. In the cross-sectional view in FIG. 16b, two pairs of sidewall structures are shown and each pair of sidewall structures of the silicon nitride layer 56 form one closed loop frame shaped structure.

Figure 16C:
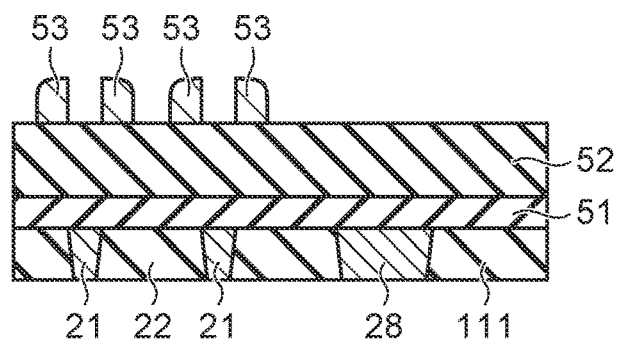

Then, as shown in FIG. 16C, anisotropic etching such as RIE, etc., of the amorphous silicon layer 53 is performed using the silicon nitride layer 56 as a mask and the silicon oxide layer 52 as a stopper. Thereby, the pattern of the silicon nitride layer 56 is transferred onto the amorphous silicon layer 53. The amorphous silicon layer 53 has the same closed loop frame structure as the silicon nitride layer 56.

Figure 14:
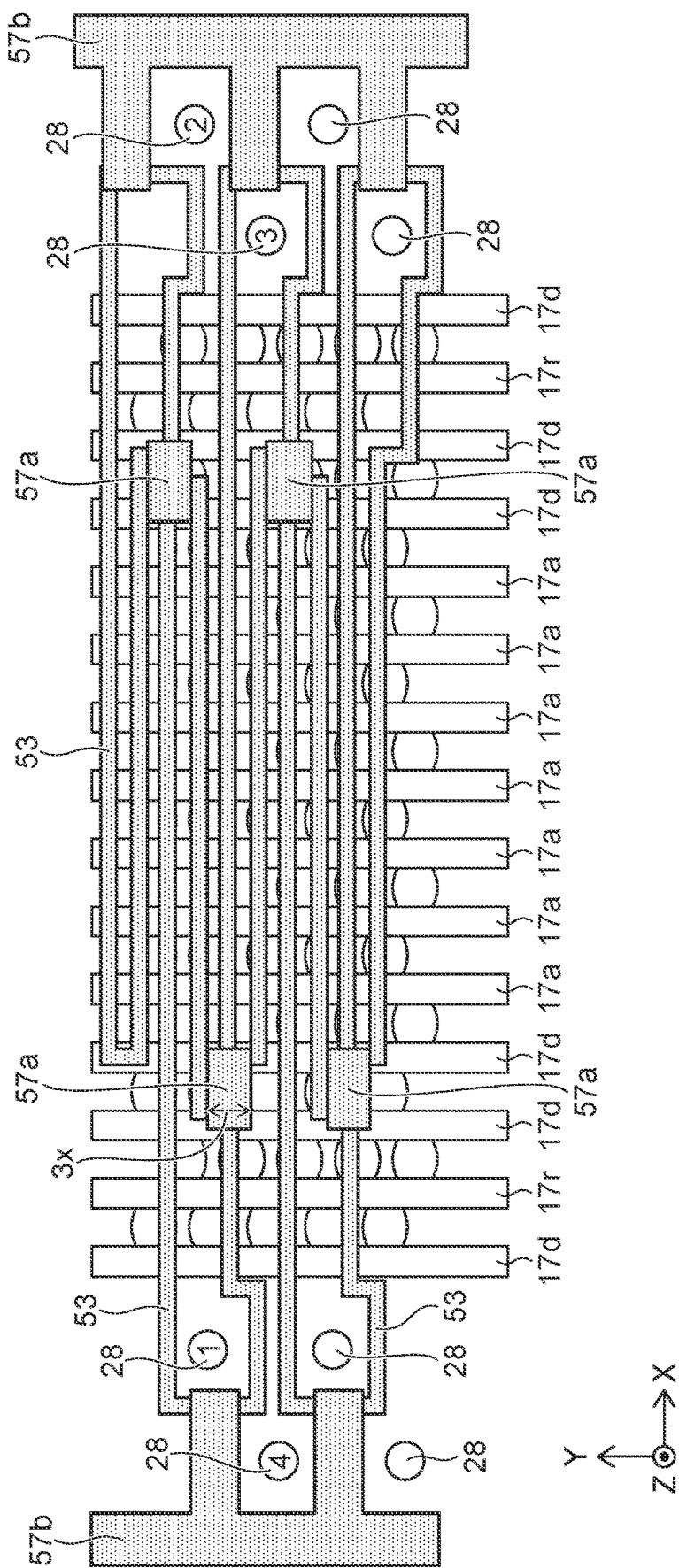
Figure 16D:
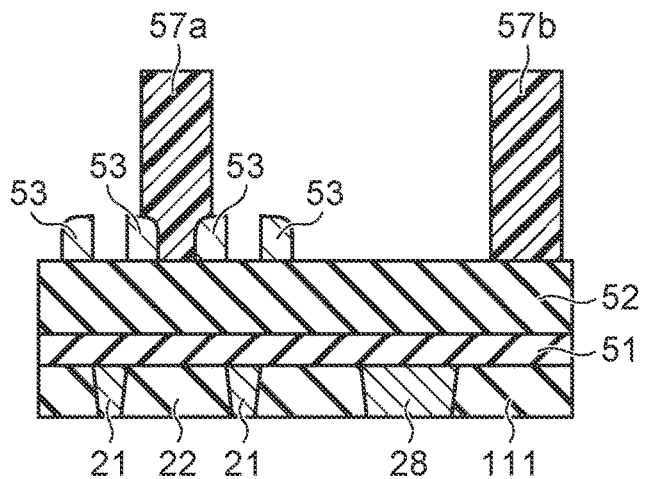

Continuing as shown in FIGS. 14 and 16D, patterns 57a and 57b are formed by performing a second lithography step. The pattern 57a is formed at two adjacent closed loop frame shaped structures of the amorphous silicon layer 53 surrounding the contact 28 marked with the numeral "1" or the numeral "3" and the region between the two adjacent frame shaped structures of the amorphous silicon layers 53. The pattern 57a is located at the boundary between the regions where the global word lines 31 marked with the numeral "2" and the numeral "4" are to be formed. The pattern 57a may be formed to cover or overlap at least partially the two adjacent structures of the amorphous silicon layers 53 for robustness of the patterning. However, the pattern 57a should not cover the region surround by each of the closed loop frame shaped structure of the amorphous silicon layers 53. That is, the pattern 57a is positioned in an open region outside the frame-shaped structures of the amorphous silicon layer 53 and between two frame-shaped structures of the amorphous silicon layer 53. But the pattern 57a does not cover the region surrounded by each of the frame-shaped structure of the amorphous silicon layer 53. Thus, the pattern 57a does not affect the function of the two global word lines 31 marked with the numeral "1" and the numeral "3". The pattern 57b is formed to surround the contact 28 located outside the frame-shaped amorphous silicon layer 53.

In the example shown in FIG. 14, the regions where the odd-numbered global word lines 31 are to be formed in a subsequent process are surrounded with the frame-shaped structure of the amorphous silicon layer 53. On the other hand, the regions where the even-numbered global word lines 31 are to be formed are located outside the frame-shaped structures of the amorphous silicon layer 53 and are formed between the frame-shaped structures of the amorphous silicon layers 53. The pattern 57a covers the region between the two adjacent closed loop fame-shaped structures of the amorphous silicon layer 53 in the X-Y plane. In the present embodiment, the length in the Y-direction of the pattern 57a is set to 3×. The position of the pattern 57a has a margin of ±1× in the Y-direction, which corresponds to the width of the amorphous silicon layer 53.

On the other hand, the pattern 57b is formed in the region surrounding the region where the pad portions 31c of the even-numbered global word lines 31 are formed. Thereby, the region where the global word lines 31 are formed is defined by the amorphous silicon layers 53, the pattern 57a, and the pattern 57b.

Figure 17A:
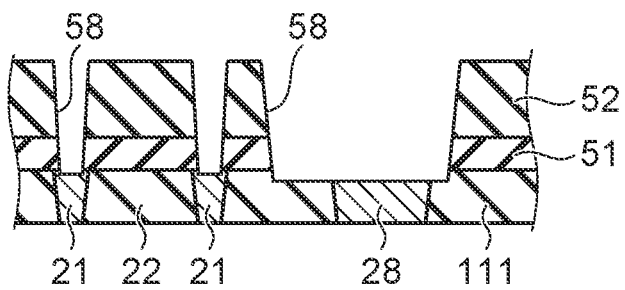

Then, as shown in FIG. 17A, anisotropic etching such as RIE, etc., of the silicon oxide layer 52 is performed using the amorphous silicon layers 53 and the patterns 57a and 57b as a mask and the silicon nitride layer 51 as a stopper. Then, anisotropic etching such as RIE, etc., of the silicon nitride layer 51 is performed. Thereby, openings 58 are formed in the regions of the silicon oxide layer 52 and the silicon nitride layer 51 where the global word lines 31 are to be formed. Then, the patterns 57a and 57b and the amorphous silicon layers 53 are removed.

Figure 17B:
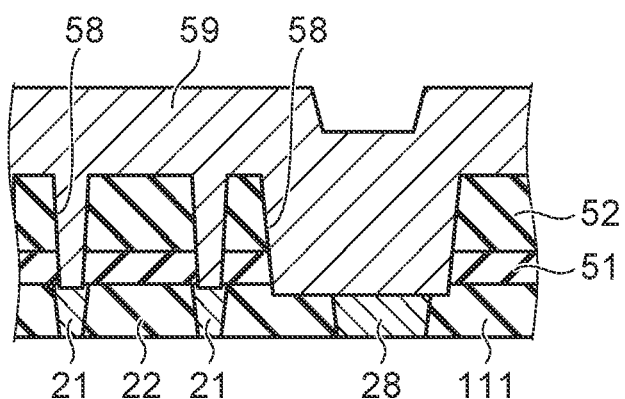

Continuing as shown in FIG. 17B, a metal film 59 is formed by depositing a metal, e.g., copper. The metal film 59 is formed inside the openings 58 and on the upper surface of the silicon oxide layer 52.

Figure 17C:
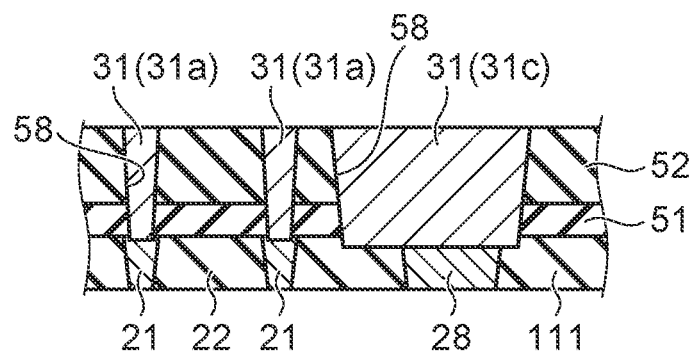

Then, as shown in FIGS. 8 and 17C, the silicon oxide layer 52 is exposed by performing planarization such as CMP (Chemical Mechanical Polishing), etc., of the metal film 59. The portion of the metal film 59 that is located on the upper surface of the silicon oxide layer 52 is removed thereby. The portions of the metal film 59 that remain inside the opening 58 become the global word lines 31. Thus, the multiple global word lines 31 are formed, and the memory array portion 133 is formed.

Continuing, the upper layer interconnect layer 134 is formed as shown in FIG. 2. Then, a lattice-like trench is formed in the passivation film 112 and the inter-layer insulating film 111. The portions that are defined by the trench become the tiles 101. Thereby, as shown in FIG. 1, the multiple tiles 101 are made on the semiconductor substrate 100. Thus, the memory device 1 according to the present embodiment is manufactured.

Effects of the present embodiment will now be described.

In the memory device 1 according to the first embodiment, when the value is read from the selected memory cell 40s as shown in FIG. 10, the potential change of the active bit line 17a connected to the memory cell 40s is detected; the potential change of at least one of the reference bit line 17r is detected; and the two are compared. Thereby, the effects of the gate leakage current are somewhat canceled, and the value that is stored in the memory cell 40s can be read with high accuracy and in a short time.

According to the embodiment as shown in FIG. 8, the local word lines 21 at positions having the reference bit line 17r interposed are not connected to the global word line 31 that is connected to the memory cell 40s. Thereby, the read potential Vread is not applied to the local word lines 21 having the reference bit line 17r interposed, and the off-potential Voff is applied to them. Therefore, the dummy memory cells 40d that are connected to the reference bit line 17r can be reliably set to the off-state; therefore, the potential of the reference bit line 17r is stabilized. The accuracy of the read operation is further increased thereby.

According to the embodiment as shown in FIG. 11, the pattern 55 is formed as a mandrel member by the first lithography. At this time, the local word lines 21 that are connected to the same global word line 31 in the memory device 1 after completion are either covered with the same pattern 55 or not covered with any pattern 55. Then, the mandrel member is slimmed as shown in FIG. 12, the amorphous silicon layer 53 is formed as a sidewall at the periphery of the mandrel member as shown in FIG. 13, and the mandrel member is removed. At this stage, the region where some (e.g., the odd-numbered) global word lines 31 are formed is enclosed by the amorphous silicon layers 53, and the region where the remaining (e.g., the even-numbered) global word lines 31 are formed is not enclosed and is positioned outside the closed loop frame shaped structures of the amorphous silicon layer 53. Then, as shown in FIG. 14, the patterns 57a and 57b are formed by the second lithography step. The pattern 57a subdivides, into two regions along the X-direction, the open region between the two adjacent frame-shaped structures of the amorphous silicon layer 53 in the Y-direction; and the pattern 57b surrounds the X-direction end portion of the subdivided region. As a result, the region where the remaining (e.g., the even-numbered) global word lines 31 are to be formed is now appropriately defined by the pattern 57a and the pattern 57b.

Thus, the basic portion 31a that has a width and a spacing of 1× each is formed by a sidewall process, and the global word line 31 that also includes the wide portion 31b having a width of 3× and the pad portion 31c having a width of 5× can be formed by the second lithography step. Accordingly, the global word lines 31 can make be made with smaller dimensions using the sidewall double patterning process. And, the reference bit lines 17r which is not applied the read potential Vread can be fabricated by avoiding periodical patterning's limitation caused by the sidewall double patterning process itself.

It also may be considered to form a global word line having the desired shape by forming a mandrel member in a first lithography step, forming a closed loop frame-shaped pattern having a width and a spacing of 1× each by a sidewall process, by cutting the frame-shaped pattern by a second lithography step, and by forming an additional pattern by a third lithography step. However, in such a case, a total of three lithography steps are necessary, and the process cost increases. Also, because the width and the spacing of the frame-shaped pattern formed by the sidewall process are 1×, the margin of the second lithography becomes ±0.5× in the Y-direction, and the difficulty of the process increases. Conversely, according to the present embodiment, the global word line that has the desired shape can be formed by two lithography steps while maintaining a lithography margin of ±1× in the Y-direction.

Second Embodiment

The following description describes mainly the differences between the first and the second embodiments, and a description of the portions that are similar or the same as the first embodiment is omitted.

Figure 18:
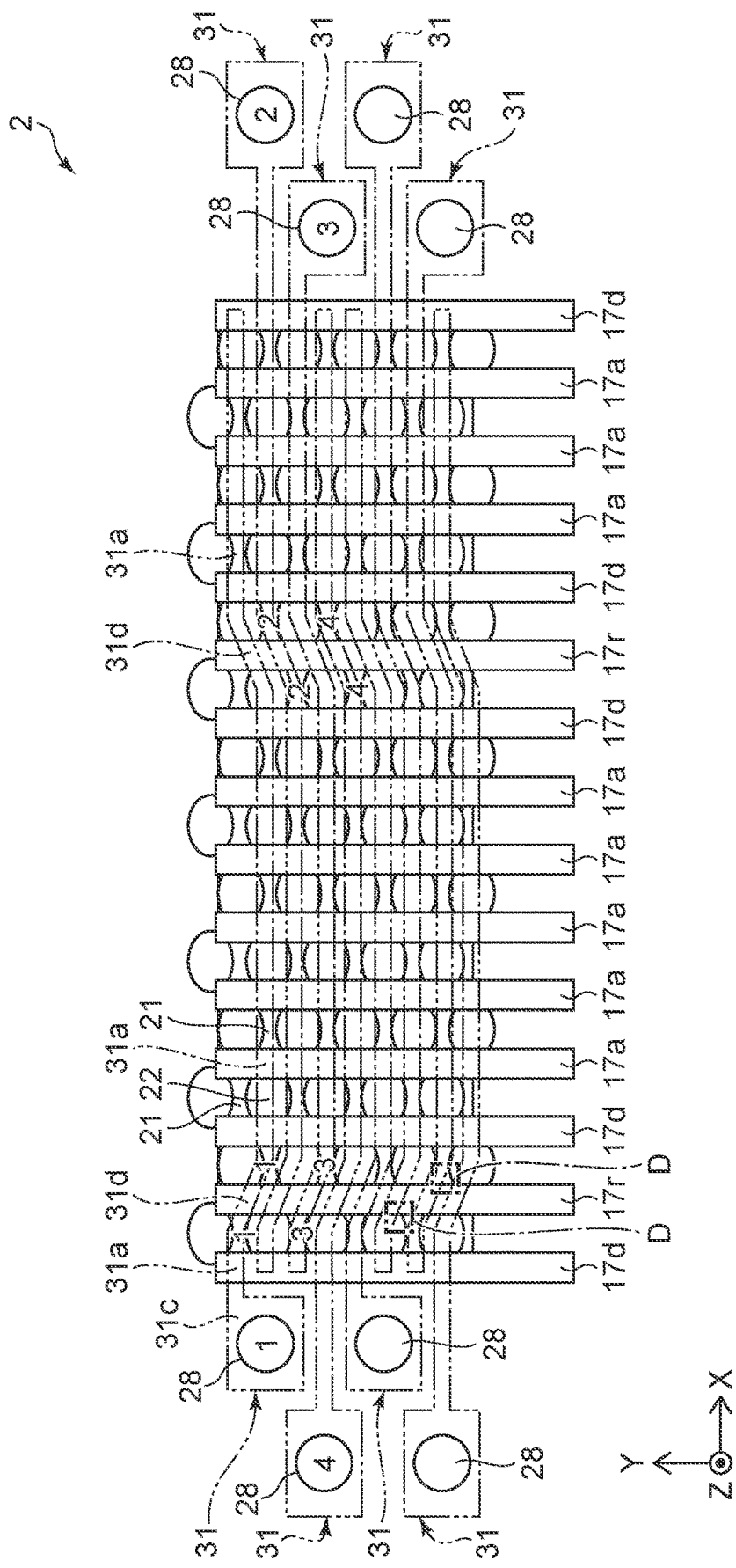
FIG. 18 is a plan view showing a memory structure body and global word lines of a second embodiment.

FIG. 18 is a plan view showing the memory structure body and the global word lines of the second embodiment.

As shown in FIG. 18, the shape of the global word line 31 of a memory device 2 according to the second embodiment is different from that of the memory device 1 according to the first embodiment (as shown in FIG. 8). Specifically, the wide portion 31b of the first embodiment is not provided in the global word line 31 of the second embodiment. Instead, a diagonal portion 31d is provided in the global word line 31 of the present embodiment and is provided between the basic portion 31a and the pad portion 31c. Similar to the first embodiment, the basic portion 31a extends in the X-direction. The diagonal portion 31d extends in a direction that is oblique to the X-direction and the Y-direction. The width of the diagonal portion 31d is substantially equal to the width of the basic portion 31a.

The diagonal portion 31d is located in the region directly above the reference bit line 17r and the gate structure bodies 20 at the two sides of the reference bit line 17r. Thereby, the two local word lines 21 that have the reference bit line 17r interposed are connected to the diagonal portion 31d of the same global word line 31. In particular, the two local word lines 21 connected to the diagonal portion 31d of the same global word line 31 are staggered in the Y-direction. Thus, the local word lines 21 associated with the reference bit line 17r located at one side of the memory structure body are connected to one set of the global word lines 31 only, for example, the odd global word lines. Meanwhile, the local word lines 21 associated with the reference bit line 17r located at the other side of the memory structure body are connected to another set of the global word lines 31 only, for example, the even global word lines. For example, the local word lines 21 associated with the reference bit line 17r located at left-hand-side in FIG. 18 are connected to the global word lines 31 marked with the numeral "1" and "3", and are not connected to the global word lines 31 marked with the numeral "2" and "4". On the other hand, the local word lines 21 located associated with the reference bit line 17r located at right-hand-side in FIG. 18 are connected to the global word lines 31 marked with the numeral "2" and "4", and not connected to the global word lines 31 marked with the numeral "1" and "3".

On the other hand, the basic portion 31a is located in the region directly above the active bit lines 17a, the dummy bit line 17d, the gate structure body 20 between the active bit lines 17a, and the gate structure body 20 between the active bit line 17a and the dummy bit line 17d. Thereby, the local word lines 21 that are connected to the memory cells 40 are connected to the basic portion 31a of the global word line 31.

According to the second embodiment, even when the wide portion 31b is not provided in the global word line 31, the local word lines 21 associated with the reference bit line 17r is prevented from connecting to the global word line 31 connected to the selected memory cell 40s to be read.

Because the width of the diagonal portion 31d is substantially equal to the width of the basic portion 31a, the arrangement interval of the diagonal portion 31d can be equal to the arrangement interval of the basic portion 31a in the Y-direction. Therefore, the diagonal portion 31d can be located at any position in the X-direction in the region directly above the memory structure body 30. Therefore, the arrangement position of the reference bit line 17r is not limited to the two X-direction end portions of the memory structure body 30 and can be placed in any position within the memory structure body 30, such as in the middle of the memory structure body.

Furthermore, as shown by region D in FIG. 18, at the diagonal portion 31d, the spacing between two adjacent global word lines 31 can be small.

Otherwise, the configuration, the operations, and the effects of the second embodiment are similar to those of the first embodiment described above.

Third Embodiment

Figure 19:
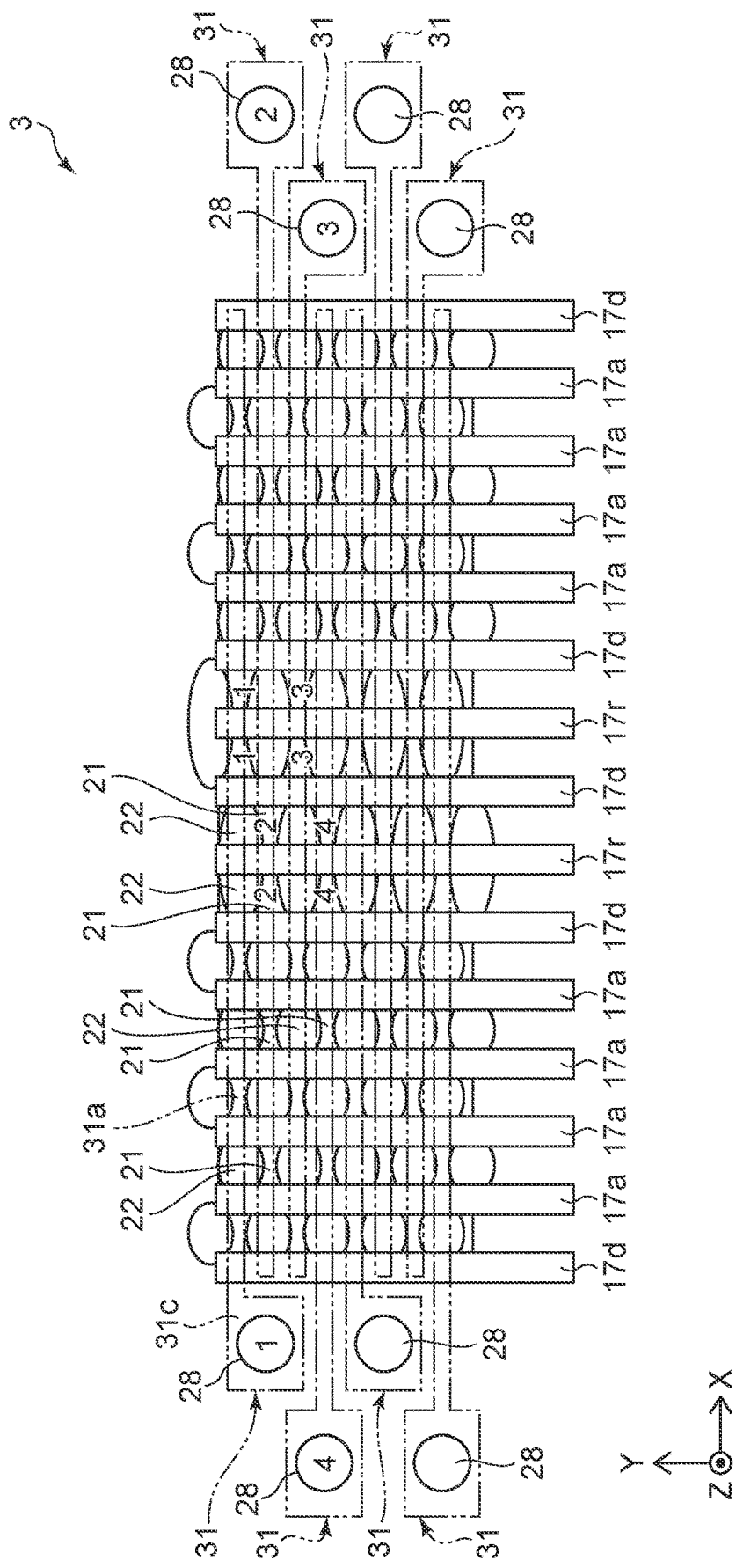
FIG. 19 is a plan view showing a memory structure body and global word lines of a third embodiment.

FIG. 19 is a plan view showing the memory structure body and the global word lines of the third embodiment.

As shown in FIG. 19, the shape of the global word line 31 of a memory device 3 according to the third embodiment also is different from that of the memory device according to the first embodiment (FIG. 8). Specifically, in the global word line 31 of the third embodiment, the wide portion 31b of the first embodiment (FIG. 8) is not provided, and the diagonal portion 31d of the second embodiment (FIG. 18) is also not provided. In the global word line 31 of the third embodiment, the basic portion 31a is directly linked to the pad portion 31c.

In the memory device 3 according to the third embodiment, the local word lines 21 that are associated a reference bit line 17r (that is, the local word lines 21 that are formed on the two sides of a reference bit line 17r) are not staggered but are positioned in substantially the same location in the Y-direction. Meanwhile, the local word lines 21 associated with a first reference bit line 17r (e.g. the reference bit line 17r on the right) and the local word lines 21 associated with a second reference bit line 17r (e.g. the reference bit line 17r on the left) are positioned staggered from each other. Thereby, a pair of local word lines 21 formed on two sides of a given reference bit line 17r are connected to the basic portion 31a of the same global word line 31. Furthermore, the local word lines 21 that are associated with different reference bit lines 17r are connected to the basic portion 31a of different global word lines 31.

As a result, the local word lines 21 located at two sides of a first reference bit line 17r are connected to one set of the global word lines 31 only, for example, the odd global word lines. Meanwhile, the local word lines 21 located at two sides of a second reference bit line 17r are connected to another set of the global word lines 31 only, for example, the even global word lines. For example, the local word lines 21 located at two sides of the reference bit line 17r located at left-hand-side in FIG. 19 are connected to the global word lines 31 marked with the numeral "2" and "4", and not connected to the global word lines 31 marked with the numeral "1" and "3". On the other hand, the local word lines 21 located at two sides of the reference bit line 17r located at right-hand-side in FIG. 19 are connected to the global word lines 31 marked with the numeral "1" and "3", and not connected to the global word lines 31 marked with the numeral "2" and "4".

A method for manufacturing the memory device according to the third embodiment will now be described.

Figure 20A:
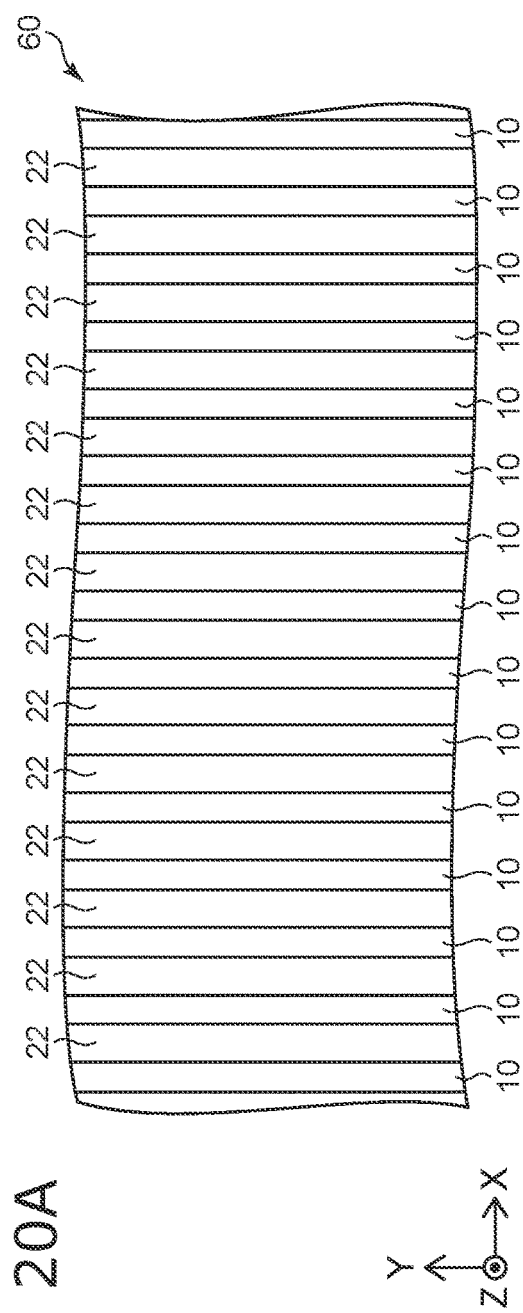
FIGS. 20A and 20B are plan views showing a method for manufacturing the memory device according to the third embodiment.
Figure 20B:
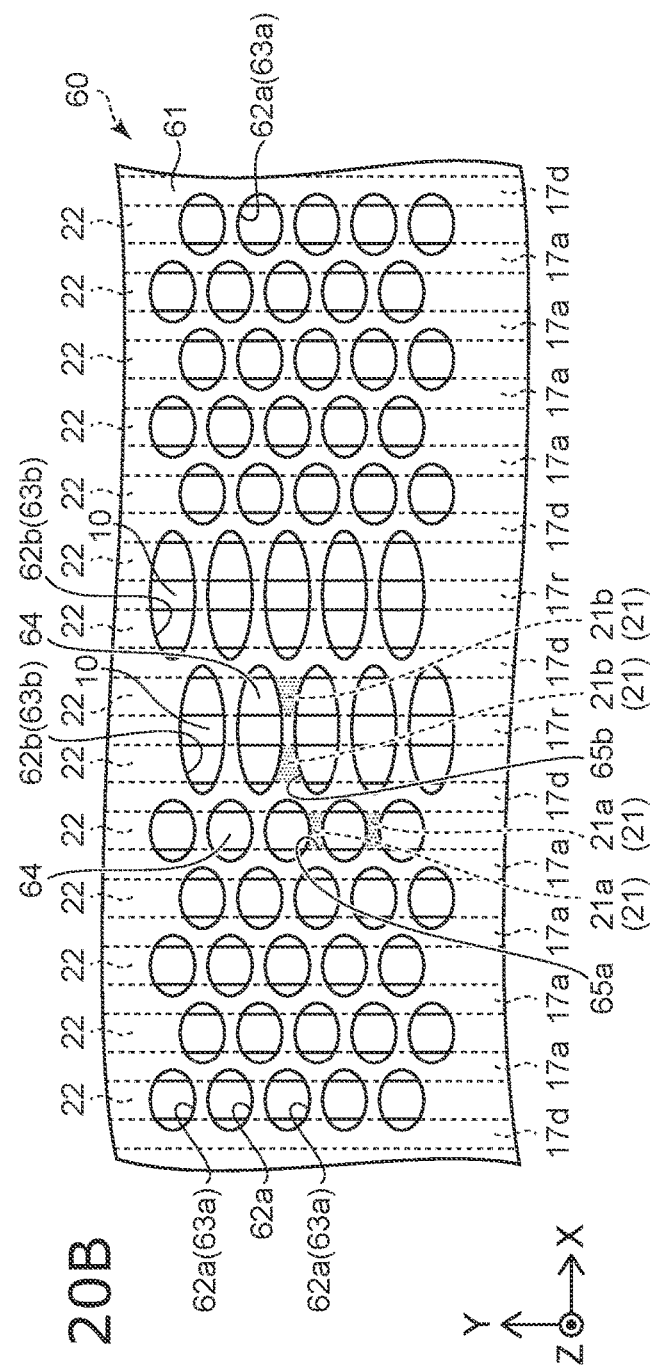

FIGS. 20A and 20B are plan views showing the method for manufacturing the memory device according to the third embodiment.

As shown in FIG. 20A, an intermediate structure body 60 is made in which the multiple source-drain structure bodies 10 and the plate-shaped insulating members 22 are alternately arranged along the X-direction. In the intermediate structure body 60, a sacrificial member that is made of, for example, silicon nitride may be formed instead of the source line 13 and the bit line 17.

Then, as shown in FIG. 20B, a mask pattern 61 is formed on the intermediate structure body 60. Openings 62a and 62b are formed in the mask pattern 61. When viewed from the Z-direction, the openings 62a and 62b are, for example, substantially elliptical. The length in the Y-direction of the opening 62b is substantially equal to the length in the Y-direction of the opening 62a. The length in the X-direction of the opening 62b is greater than the length in the X-direction of the opening 62a. As thus configured, one insulating member 22 is exposed inside the opening 62a while two adjacent insulating members 22 and one source-drain structure body 10 between the two adjacent insulating members 22 are exposed inside the opening 62b.

Continuing, anisotropic etching such as RIE, etc., of the insulating members 22 is performed using the mask pattern 61 as a mask. Thereby, holes 63a and 63b are formed in the insulating members 22. The hole 63a is formed in a part of a region directly below the opening 62a, and the hole 63b is formed in a part of a region directly below the opening 62b. The source-drain structure body 10 is exposed at the side surfaces of the holes 63a and 63b facing the X-direction. At this time, the source-drain structure body 10 is substantially not etched because the etching is impeded by the insulating body 12 made of silicon oxycarbide (SiOC) or an etching stop layer provided above the insulating body 12. Therefore, when viewed from the Z-direction, the portion of the reference bit line 17r that overlaps the hole 63b is not etched. When sacrificial members are formed instead of the source line 13 and the bit line 17 in the intermediate structure body 60, the sacrificial members may be replaced with metal members via the holes 63a and 63b.

Then, the mask pattern 61 is removed. Then, sacrifice members 64 are filled in the holes 63a and 63b. And then, portions of the insulation members 22 located between holes 63a and between holes 63b are removed. Thereby, holes 65a and 65b are formed between the sacrifice members 64. The arrangement pattern of the holes 65*a* and 65*b* is a pattern in which the arrangement pattern of the holes 63*a* and 63*b* is inverted in the insulation members 22. Then, the charge storage films 23 are formed on the inner surfaces of the holes 65*a* and 65*b*. Then, the local word lines 21 are formed by filling a metal material into the holes 65*a* and 65*b*. Local word lines 21*a* of the local word lines 21 formed in the holes 65*a* are located between two of the holes 63*a* filled by the sacrifice member 64. On the other hand, local word lines 21*b* of the local word lines 21 formed in the holes 65*b* are located between two of the holes 63*b* filled by the sacrifice member 64. Then, the sacrifice members 64 are removed from the holes 63*a* and 63*b*. Then, insulating material such as silicon oxide is backfilled in the holes 63*a* and 63*b* to form a part of the insulating member 22. Thus, the memory structure body 30 is manufactured.

The local word lines 21*b* that are located at the two sides of the reference bit line 17*r* are formed in the holes 65*b* and therefore have different shapes when viewed from the Z-direction from the local word lines 21*a* formed in the holes 65*a*.

In the third embodiment shown in FIG. 19, it is unnecessary to provide the wide portion 31*b* in the global word line 31; therefore, the reference bit line 17*r* can be located at any position in the X-direction of the memory structure body 30. Also, it is unnecessary to provide the diagonal portion 31*d* in the global word line 31; therefore, the portion where the short spacing as shown by region D of FIG. 18 does not occur.

Otherwise, the configuration, the operations, and the effects of the third embodiment are similar to those of the first embodiment described above. Although an example is shown in the third embodiment in which the opening 62*b* of the mask pattern 61 has a size that extends over two insulating members 22, the size is not limited thereto; the size may extend over three or more insulating members 22.

Fourth Embodiment

Figure 21:
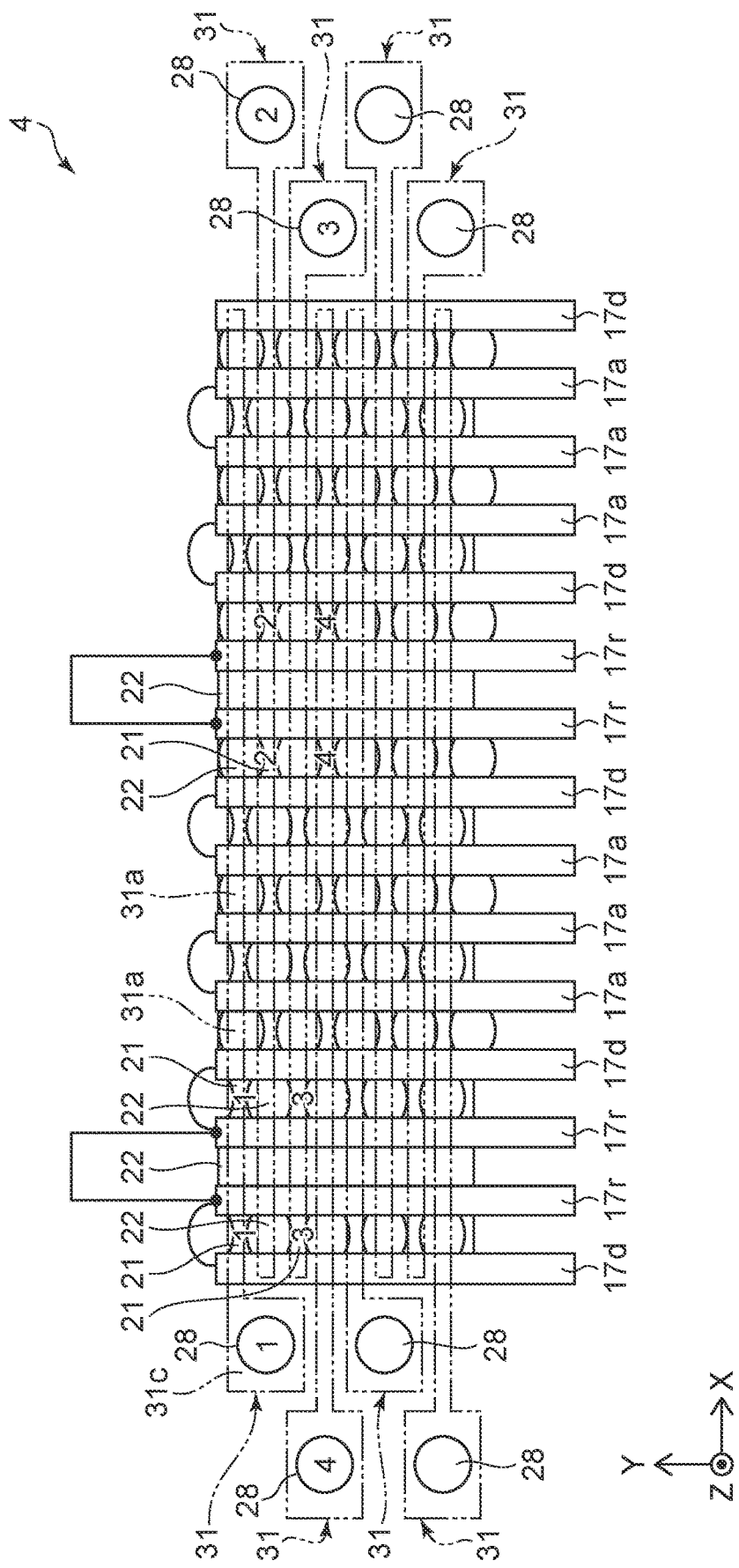
FIG. 21 is a plan view showing a memory structure body and global word lines of a fourth embodiment.

FIG. 21 is a plan view showing the memory structure body and the global word lines of the fourth embodiment.

As shown in FIG. 21, the configuration of the global word line 31 of a memory device 4 according to the fourth embodiment is similar to that of the third embodiment. Namely, in the global word line 31, the basic portion 31*a* and the pad portion 31*c* are provided, but the wide portion 31*b* FIG. 8) and the diagonal portion 31*d* (18) are not provided.

In the memory device 4, two adjacent bit lines 17 of the multiple bit lines 17 are used as the reference bit lines 17*r*. The two adjacent reference bit lines 17*r* are connected to each other in a region, e.g., the upper layer interconnect layer 134 or the lower layer interconnect layer 132, other than the region between these two reference bit lines 17*r*. Therefore, the same potential is constantly applied to the two adjacent reference bit lines 17*r*.

Between the two adjacent reference bit lines 17*r*, one plate-shaped insulating member 22 may be provided, or multiple columnar insulating members 22 and conductive bodies similar to the local word lines 21 may be alternately arranged along the Y-direction. However, the reference bit line 17*r* does not function as a bit line driving the memory cells; therefore, the conductive bodies that are located between a pair of reference bit line 17*r* do not function as the local word lines 21.

According to the fourth embodiment, it is unnecessary to provide the wide portion 31*b* in the global word line 31; therefore, the reference bit line 17*r* can be located at any position in the X-direction of the memory structure body 30. Also, it is unnecessary to provide the diagonal portion 31*d* in the global word line 31; therefore, the portion where the short spacing as shown by region D of FIG. 18 does not easily occur. When viewed from the Z-direction, the shapes of the local word lines 21 located at the two sides of the two adjacent reference bit lines 17*r* can be the same as the shapes of the other local word lines 21.

As a result, the local word lines 21 located at two sides of a first pair of adjacent reference bit lines 17*r* (e.g. the reference bit line pair on the left hand side) are connected to one set of the global word lines 31. Meanwhile, the local word lines 21 located at two sides of a second pair of adjacent reference bit lines 17*r* (e.g. the reference bit line pair on the right hand side) are connected to another set of the global word lines 31. For example, the local word lines 21 located at two sides of the two reference bit lines 17*r* located at left-hand-side in FIG. 21 are connected to the global word lines 31 marked with the numeral "1" and "3", and not connected to the global word lines 31 marked with the numeral "2" and "4". On the other hand, the local word lines 21 located at two sides of the two adjacent reference bit lines 17*r* located at right-hand-side in FIG. 21 are connected to the global word lines 31 marked with the numeral "2" and "4", and not connected to the global word lines 31 marked with the numeral "1" and "3".

Otherwise, the configuration, the operations, and the effects of the fourth embodiment are similar to those of the first embodiment described above.

Fifth Embodiment

Figure 22:
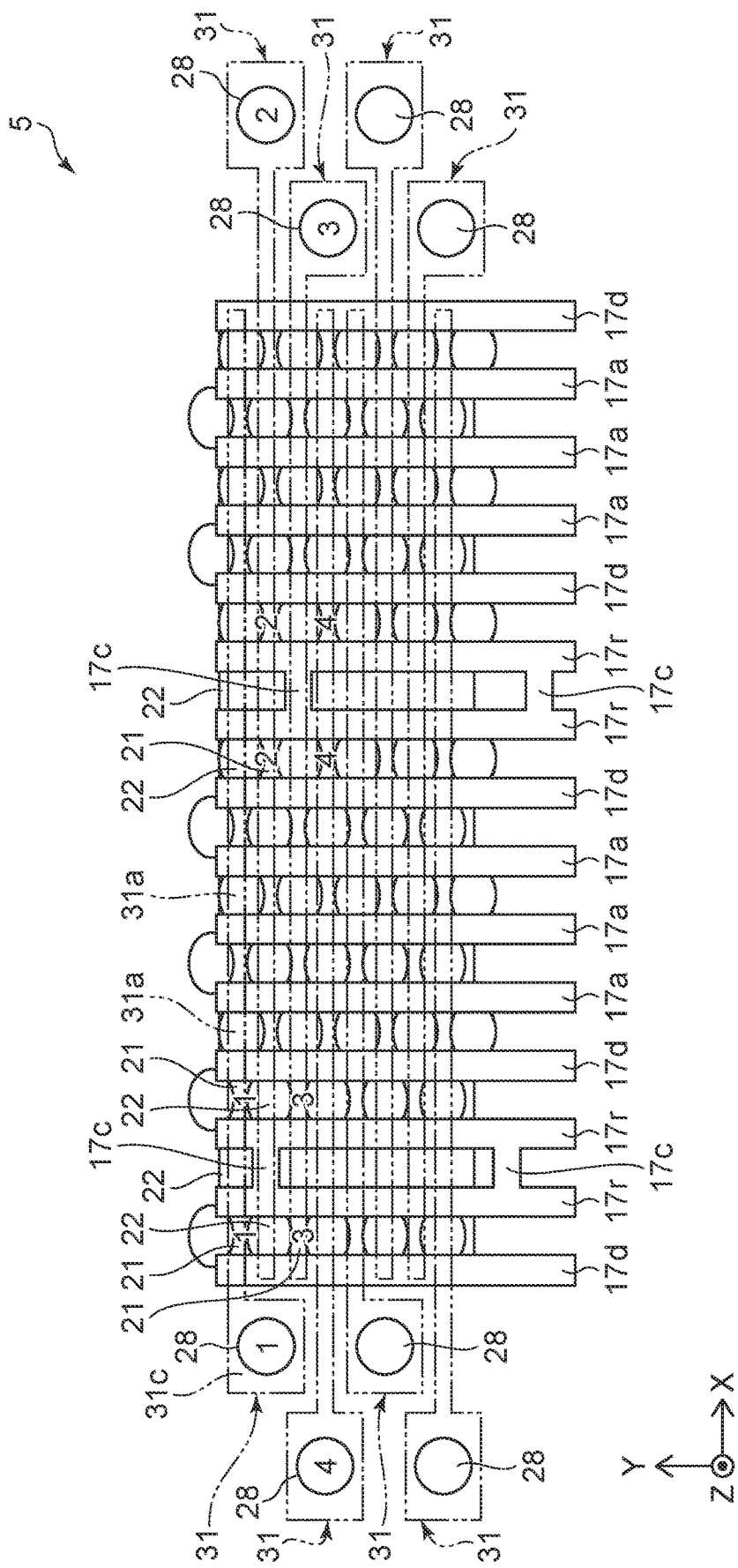
FIG. 22 is a plan view showing a memory structure body and global word lines of a fifth embodiment.

FIG. 22 is a plan view showing the memory structure body and the global word lines of the fifth embodiment.

In a memory device 5 according to the fifth embodiment as shown in FIG. 22, two adjacent bit lines 17 of the multiple bit lines 17 are used as the reference bit lines 17*r*. The two adjacent reference bit lines 17*r* is connected to each other via a connection portion 17*c* extending in the X-direction. Therefore, the same potential is constantly applied to the two adjacent reference bit lines 17*r*. The connection portion 17*c* is provided inside the memory structure body 30 in each layer including the bit line 17.

Otherwise, the configuration, the operations, and the effects of the fifth embodiment are similar to those of the fourth embodiment described above.

The embodiments described above are examples embodying the invention; and the invention is not limited to these embodiments. For example, additions, deletions, or modifications of some of the components or processes of the embodiments described above also are included in the invention. The embodiments described above can be implemented in combination with each other.

The invention claimed is:
1. A memory device, comprising:
a plurality of source-drain structure bodies and a plurality of gate structure bodies arranged alternately along a first direction; and
a plurality of global word lines,
each of the plurality of source-drain structure bodies including
a bit line extending in a second direction perpendicular to the first direction,
a first semiconductor layer extending in the second direction, being connected to the bit line, and being of a first conductivity type, a second semiconductor layer extending in the second direction, being separated from the first semiconductor layer in a third direction, and being of the first conductivity type, the third direction perpendicular to a plane parallel to the first and second directions, and a third semiconductor layer contacting the first and second semiconductor layers and being of a second conductivity type, each of the plurality of gate structure bodies including
a plurality of local word lines arranged in the second direction, each local word line extending in the third direction, and
a charge storage film provided between the third semiconductor layer and each local word line of the plurality of local word lines, wherein a first source-drain structure body of the plurality of source-drain structure bodies includes the bit line forming a first reference bit line; and wherein a first global word line of the plurality of global word lines connects to the local word lines in the gate structure bodies of the plurality of gate structure bodies formed on both sides of the first reference bit line and to the local word lines formed in alternate gate structure bodies of the plurality of gate structure bodies that are formed between the remaining plurality of source-drain structure bodies.

2. The memory device according to claim 1, wherein
the local word lines in adjacent gate structure bodies of the plurality of gate structure bodies are formed staggered in the second direction, and each global word line of the plurality of global word lines includes:
a first portion extending in the first direction and connecting to the local word lines formed in alternate gate structure bodies of the plurality of gate structure bodies between the plurality of source-drain structure bodies other than the first source-drain structure body of the plurality of source-drain structure bodies; and
a second portion connected to the local word lines that are formed staggered in the gate structure bodies of the plurality of gate structure bodies that are adjacent to the first source-drain structure body of the plurality of source-drain structure bodies forming the reference bit line, and
a width of the second portion in the second direction is greater than a width of the first portion.

3. The memory device according to claim 2, wherein
the global word line of the plurality of global word lines further includes a third portion, a width of the third portion in the second direction is greater than the width of the second portion, and
the second portion is located between the first portion and the third portion.

4. The memory device according to claim 1, wherein
the local word lines in adjacent gate structure bodies of the plurality of gate structure bodies are formed staggered in the second direction, and each global word line of the plurality of global word lines includes:
a first portion extending in the first direction and connecting to the local word lines formed in alternate gate structure bodies of the plurality of gate structure bodies between the plurality of source-drain structure bodies other than the first source-drain structure body of the plurality of source-drain structure bodies; and
a second portion connected to the local word lines that are formed staggered in the gate structure bodies of the plurality of gate structure bodies that are adjacent to the first source-drain structure body of the plurality of source-drain structure bodies forming the reference bit line, the second portion extending in a direction oblique to the first direction and the second direction.

5. The memory device according to claim 1, wherein
the local word lines in the gate structure bodies of the plurality of gate structure bodies that are adjacent to the first source-drain structure body of the plurality of source-drain structure bodies forming the reference bit line are positioned in substantial the same locations in the second direction,
the local word lines in the remaining gate structure bodies of the plurality of gate structure bodies are formed staggered in the second direction, and
each global word line of the plurality of global word lines extends in the first direction and connects to the local word lines in the gate structure bodies of the plurality of gate structure bodies adjacent to the first source-drain structure body of the plurality of source-drain structure bodies and to the local word lines formed in alternate gate structure bodies of the plurality of gate structure bodies between the plurality of source-drain structure bodies other than the first source-drain structure body of the plurality of source-drain structure bodies.

6. The memory device according to claim 5, further comprising a second source-drain structure body of the plurality of source-drain structure bodies including a bit line being a second reference bit line,
wherein a first global word line of the plurality of global word lines connects to the local word lines in the gate structure bodies of the plurality of gate structure bodies formed on both sides of the first reference bit line and to the local word lines formed in alternate gate structure bodies of the plurality of gate structure bodies that are formed between the remaining plurality of source-drain structure bodies; and a second global word line of the plurality of global word lines connects to the local word lines in the gate structure bodies of the plurality of gate structure bodies formed on both sides of the second reference bit line and to the local word lines formed in alternate gate structure bodies of the plurality of gate structure bodies that are formed between the remaining plurality of source-drain structure bodies.

7. The memory device according to claim 1, wherein
the first reference bit line comprises the bit line from the first source-drain structure body of the plurality of source-drain structure bodies and the bit line from a second source-drain structure body of the plurality of source-drain structure bodies adjacent to the first source-drain structure body of the plurality of source-drain structure bodies, the bit lines being connected to each other.

8. The memory device according to claim 1, further comprising:
a plurality of sense amplifiers configured to detect a current flowing in the bit lines of the plurality of source-drain structure bodies; and a comparison circuit comparing outputs of two of the sense amplifiers, one of the sense amplifiers being coupled to detect the current flowing in the first reference bit line.

9. The memory device according to claim 1, wherein each of the plurality of source-drain structure bodies further includes a source line extending in the second direction and being connected to the second semiconductor layer.

10. The memory device according to claim 1, wherein each of the plurality of source-drain structure bodies further includes an insulating layer located between the first semiconductor layer and the second semiconductor layer, and the bit line, the first semiconductor layer, the insulating layer, and the second semiconductor layer are stacked in the third direction.

11. The memory device according to claim 10, wherein a unit stacked body includes the bit line, the first semiconductor layer, the insulating layer, and the second semiconductor layer stacked in the third direction, a plurality of the unit stacked bodies is provided in each of the plurality of source-drain structure bodies, and the plurality of unit stacked bodies is stacked in the third direction.

\* \* \* \* \*